(12) United States Patent
Shimada et al.

(10) Patent No.: US 7,000,156 B2
(45) Date of Patent: Feb. 14, 2006

(54) DEVICES FOR STORING AND ACCUMULATING DEFECT INFORMATION, SEMICONDUCTOR DEVICE AND DEVICE FOR TESTING THE SAME

(75) Inventors: Yutaka Shimada, Tokyo (JP); Yoshinori Fujiwara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 481 days.

(21) Appl. No.: 10/261,458

(22) Filed: Oct. 2, 2002

(65) Prior Publication Data

US 2003/0221144 A1 Nov. 27, 2003

(30) Foreign Application Priority Data

May 22, 2002 (JP) .............................. 2002-148199

(51) Int. Cl.
*G11C 29/00* (2006.01)
*G11C 7/00* (2006.01)

(52) U.S. Cl. ..................................... 714/711; 365/200

(58) Field of Classification Search .................... 714/8, 714/710, 711, 718, 719, 723; 365/200–201
See application file for complete search history.

(56) References Cited

U.S. PATENT DOCUMENTS

| 4,628,509 | A | | 12/1986 | Kawaguchi |
|---|---|---|---|---|
| 5,317,573 | A | * | 5/1994 | Bula et al. .................. 714/711 |
| 5,715,253 | A | * | 2/1998 | Kim et al. ................... 714/711 |
| 5,983,374 | A | * | 11/1999 | Todome et al. ............. 714/718 |
| 6,158,016 | A | * | 12/2000 | Pignon .......................... 714/6 |
| 6,425,095 | B1 | * | 7/2002 | Yasui ........................... 714/42 |
| 6,442,724 | B1 | * | 8/2002 | Augarten .................... 714/738 |
| 6,535,993 | B1 | * | 3/2003 | Hamada et al. ................ 714/6 |
| 6,687,862 | B1 | * | 2/2004 | Martinez .................... 714/723 |
| 6,795,942 | B1 | * | 9/2004 | Schwarz ..................... 714/718 |

FOREIGN PATENT DOCUMENTS

JP 59-207496 11/1984

* cited by examiner

*Primary Examiner*—Guy Lamarre
*Assistant Examiner*—Cynthia Britt
(74) *Attorney, Agent, or Firm*—Leydig, Voit & Mayer, Ltd.

(57) ABSTRACT

A defect information storing device includes two tables for storing information on defective points of a semiconductor device. The first table stores column addresses and number of defective points existing at this column address for (r×c+c) lines. The second table stores row addresses, number of defective points existing at this row address, and column identifiers indicating the storage place of the column address of the defective point in the first table for (r×c+r) lines.

10 Claims, 29 Drawing Sheets

ROW SIDE 41

| ROW COUNT | ROW ADDRESS | COLUMN ID |
|---|---|---|
| 1 | x1 | 0 |
|  |  |  |
|  |  |  |

COLUMN SIDE 42

| COLUMN COUNT | COLUMN ADDRESS |
|---|---|
| 1 | y1 |
|  |  |
|  |  |

FIG.7

| ROW SIDE 41 | | | | | COLUMN SIDE 42 | |
|---|---|---|---|---|---|---|
| ROW COUNT | ROW ADDRESS | COLUMN ID (1) | COLUMN ID (1) | | COLUMN COUNT | COLUMN ADDRESS |
| 2BITS | 9BITS | 3BITS | 3BITS | | 2BITS | 7BITS |
| 2BITS | 9BITS | 3BITS | 3BITS | | 2BITS | 7BITS |
| 2BITS | 9BITS | 3BITS | 3BITS | | 2BITS | 7BITS |
| 2BITS | 9BITS | 3BITS | 3BITS | | 2BITS | 7BITS |
| 2BITS | 9BITS | 3BITS | 3BITS | | 2BITS | 7BITS |
| 2BITS | | | | | | |

6 LINES

FIG.12

| ROW SIDE 41 | | | | COLUMN SIDE 42 | |
|---|---|---|---|---|---|
| ROW COUNT | ROW ADDRESS | COLUMN ID (1) | COLUMN ID (2) | COLUMN COUNT | COLUMN ADDRESS |
|  |  |  |  |  |  |
|  |  |  |  |  |  |
|  |  |  |  |  |  |
|  |  |  |  |  |  |
|  |  |  |  |  |  |
|  |  |  |  |  |  |

FIG.13

|    | y0 | y1 | y2 | y3 | y4 |
|----|----|----|----|----|----|
| x0 | 1  | 2  |    |    |    |
| x1 | 3  | 4  |    |    |    |
| x2 |    |    |    |    |    |
| x3 |    |    |    |    |    |
| x4 |    |    |    |    |    |

X0 TO X4 DENOTES ROW ADDRESS
Y0 TO Y4 DENOTES COLUMN ADDRESS

FIG.14A

DEFECT 1

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 1 | y0 |
| | | | | | |
| | | | | | |
| | | | | | |
| | | | | | |
| | | | | | |

FIG.14B

DEFECT 2

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 2 | x0 | 0 | 1 | 1 | y0 |
| | | | | 1 | y1 |
| | | | | | |
| | | | | | |
| | | | | | |
| | | | | | |

FIG.14C

DEFECT 3

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 2 | x0 | 0 | 1 | 2 | y0 |
| 1 | x1 | 0 | | 1 | y1 |
| | | | | | |
| | | | | | |
| | | | | | |
| | | | | | |

FIG.14D

DEFECT 4

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 2 | x0 | 0 | 1 | 2 | y0 |
| 2 | x1 | 0 | 1 | 2 | y1 |
| | | | | | |
| | | | | | |
| | | | | | |

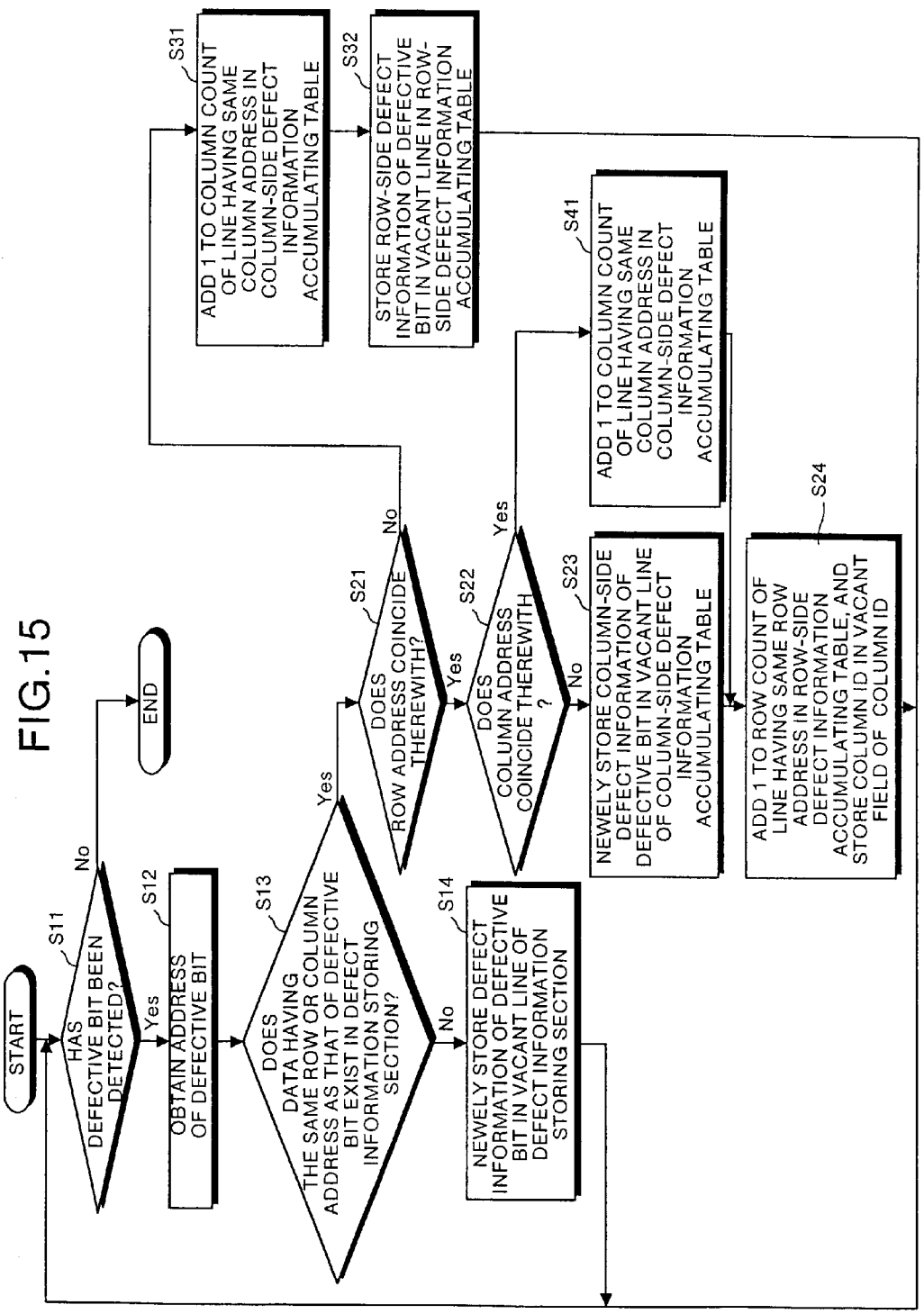

FIG.16

|    | y0 | y1 | y2 | y3 | y4 | y5 | y6 | y7 |
|----|----|----|----|----|----|----|----|----|
| x0 | 1  |    |    |    |    |    |    |    |
| x1 |    | 2  |    |    |    |    |    |    |
| x2 |    |    | 3  |    |    |    |    |    |
| x3 |    |    |    | 4  |    |    |    |    |
| x4 |    |    |    |    | 5  |    |    |    |
| x5 |    |    |    |    |    | 6  |    |    |
| x6 |    |    |    |    |    |    | 7  |    |
| x7 |    |    |    |    |    |    |    |    |

X0 TO X4 DENOTES ROW ADDRESS
Y0 TO Y4 DENOTES COLUMN ADDRESS

FIG.17

| ROW SIDE (41) | | | | COLUMN SIDE (42) | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 |  | 1 | y0 |
| 1 | x1 | 1 |  | 1 | y1 |
| 1 | x2 | 2 |  | 1 | y2 |
| 1 | x3 | 3 |  | 1 | y3 |
| 1 | x4 | 4 |  | 1 | y4 |
| 1 | x5 | 5 |  | 1 | y5 |

FIG.18

|    | y0 | y1 | y2 | y3 | y4 |
|----|----|----|----|----|----|
| x0 | 1  |    |    |    |    |
| x1 | 2  |    |    |    |    |
| x2 | 3  |    |    |    |    |
| x3 |    |    |    |    |    |
| x4 |    |    |    |    |    |

X0 TO X4 DENOTES ROW ADDRESS
Y0 TO Y4 DENOTES COLUMN ADDRESS

FIG.19A

DEFECT 1

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 1 | y0 |
| | | | | | |
| | | | | | |
| | | | | | |
| | | | | | |
| | | | | | |

FIG.19B

DEFECT 2

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 2 | y0 |
| 1 | x1 | 0 | | | |
| | | | | | |
| | | | | | |
| | | | | | |
| | | | | | |

FIG.19C

DEFECT 3

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 3 | y0 |
| 1 | x1 | 0 | | | |
| | | | | | |
| | | | | | |
| | | | | | |
| | | | | | |

FIG.20

|     | y0 | y1 | y2 | y3 | y4 |
|-----|----|----|----|----|----|
| x0  | 1  | 2  | 4  |    |    |
| x1  |    |    | 3  |    |    |
| x2  |    |    |    |    |    |
| x3  |    |    |    |    |    |
| x4  |    |    |    |    |    |

X0 TO X4 DENOTES ROW ADDRESS
Y0 TO Y4 DENOTES COLUMN ADDRESS

FIG.21A

DEFECT 1

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 1 | y0 |
| | | | | | |
| | | | | | |
| | | | | | |
| | | | | | |
| | | | | | |

FIG.21B

DEFECT 2

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 2 | x0 | 0 | 1 | 1 | y0 |
| | | | | 1 | y1 |
| | | | | | |
| | | | | | |
| | | | | | |
| | | | | | |

FIG.21C

DEFECT 3

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 2 | x0 | 0 | 1 | 1 | y0 |
| 1 | x1 | 2 | | 1 | y1 |
| | | | | 1 | y2 |
| | | | | | |
| | | | | | |
| | | | | | |

FIG.21D

DEFECT 4

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 1 | y0 |
| 1 | x1 | 2 | | 1 | y1 |
| | | | | 1 | y2 |
| | | | | | |
| | | | | | |
| | | | | | |

FIG.22

|    | y0 | y1 | y2 | y3 | y4 |
|----|----|----|----|----|----|
| x0 | 1  |    |    |    |    |
| x1 | 2  |    |    |    |    |
| x2 | 3  |    |    |    |    |
| x3 | 4  |    |    |    |    |
| x4 |    |    |    |    |    |

X0 TO X4 DENOTES ROW ADDRESS
Y0 TO Y4 DENOTES COLUMN ADDRESS

FIG.23A

DEFECT 1

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 1 | y0 |
| | | | | | |
| | | | | | |
| | | | | | |
| | | | | | |
| | | | | | |

FIG.23B

DEFECT 2

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 2 | y0 |
| 1 | x1 | 0 | | | |
| | | | | | |
| | | | | | |
| | | | | | |
| | | | | | |

FIG.23C

DEFECT 3

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 3 | y0 |
| 1 | x1 | 0 | | | |
| | | | | | |
| | | | | | |
| | | | | | |
| | | | | | |

FIG.23D

DEFECT 4

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 3 | y0 |
| 1 | x1 | 0 | | | |
| | | | | | |
| | | | | | |
| | | | | | |
| | | | | | |

SEMICONDUCTOR MEMORY CELL — 101

OUTPUT VALUE

|    | y0 | y1 | y2 | y3 | y4 |
|----|----|----|----|----|----|
| x0 | 1  | 1  | 1  |    |    |
| x1 |    |    |    |    |    |
| x2 |    |    |    |    |    |
| x3 |    |    |    |    |    |
| x4 |    |    |    |    |    |

X0 TO X4 DENOTES ROW ADDRESS
Y0 TO Y4 DENOTES COLUMN ADDRESS

| ROW SIDE 41 | | | | COLUMN SIDE 42 | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | | | | |
| | | | | | |
| | | | | | |
| | | | | | |
| | | | | | |

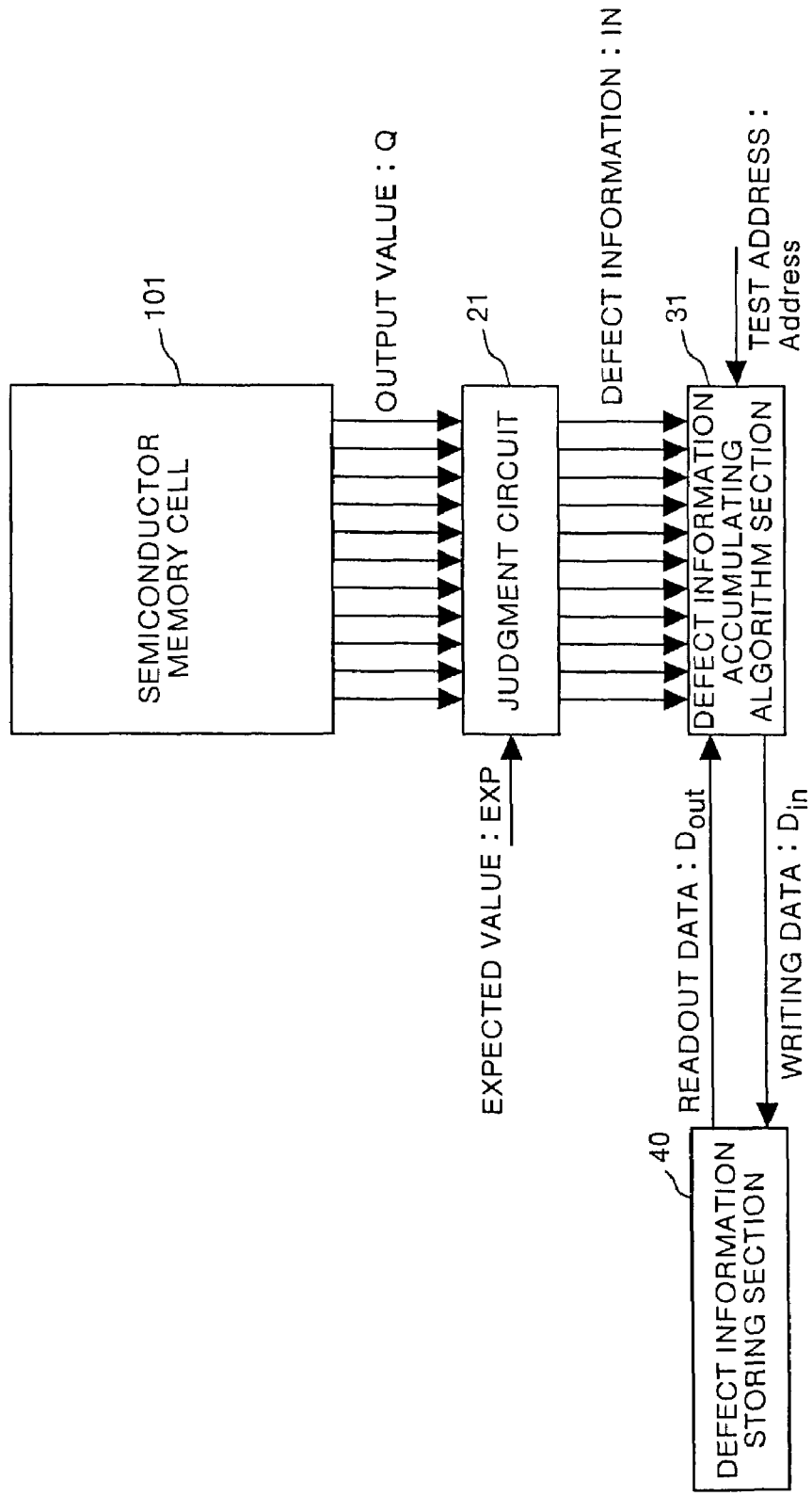

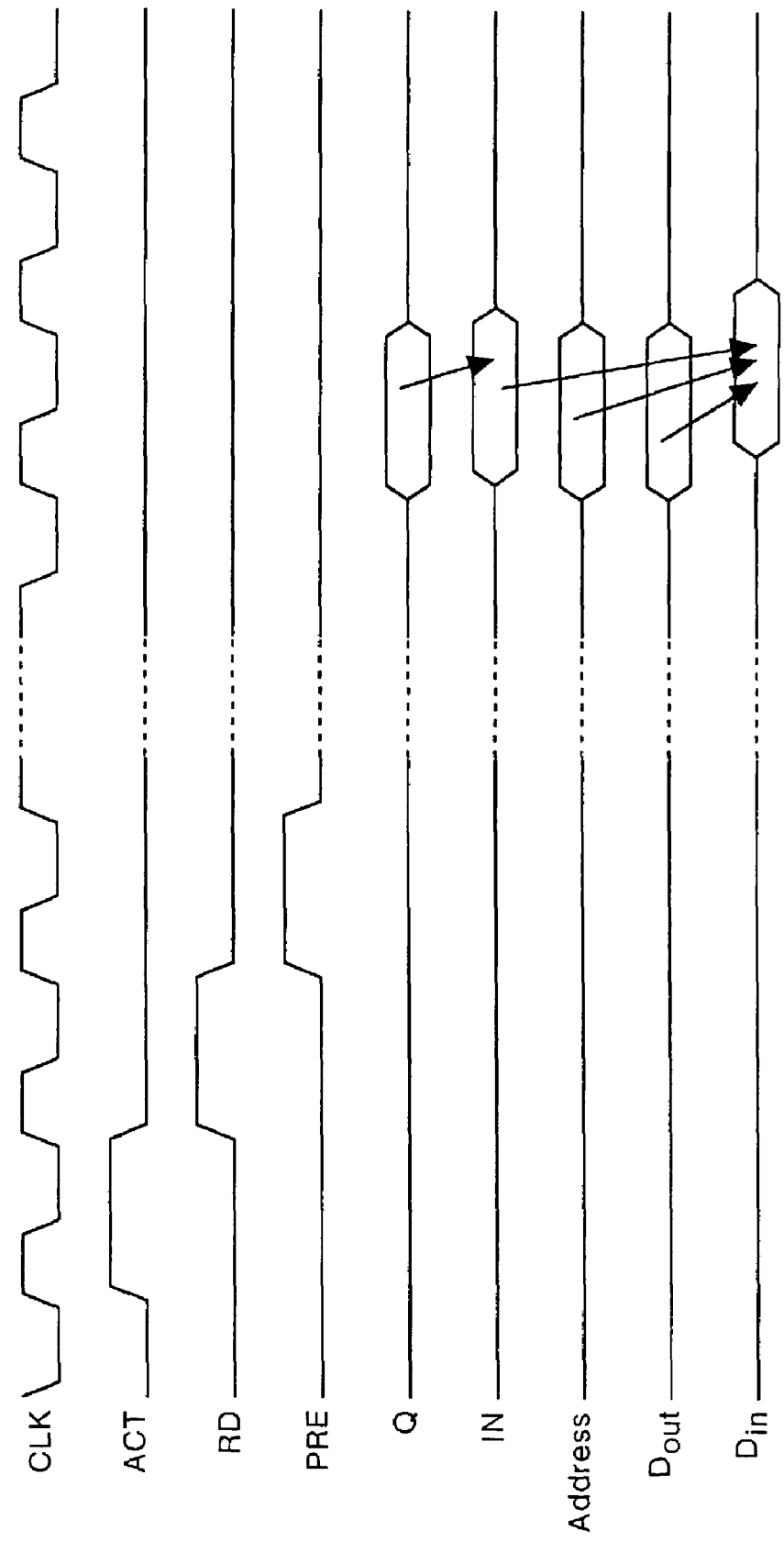

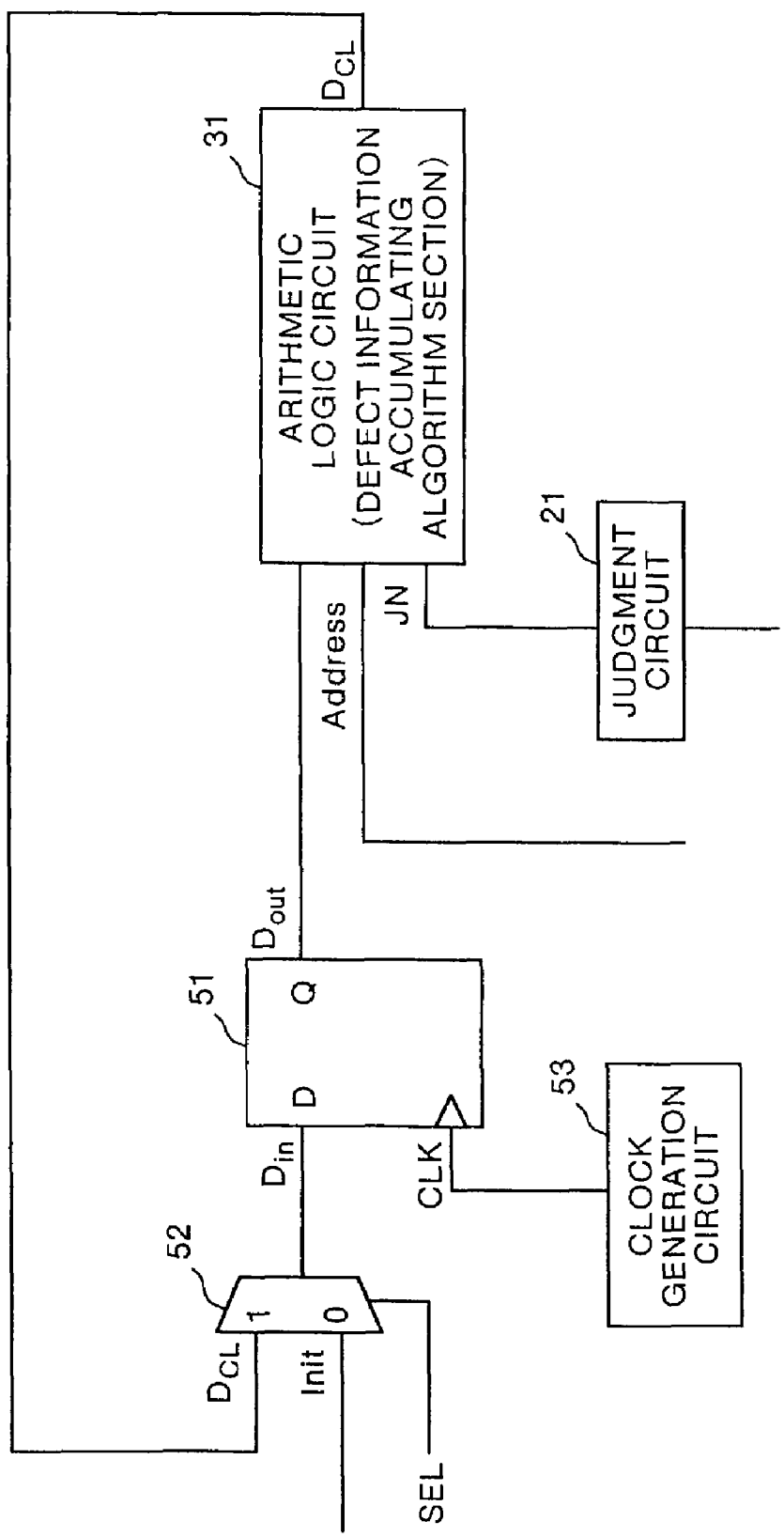

FIG.30

| | | | COLUMN ADDRESS | | |
|---|---|---|---|---|---|
| | | | COINCIDE | | NOT COINCIDE |
| | | | COLUMN COUNT < r | COLUMN COUNT >= r | |
| COINCIDE | ROW COUNT < c | NUMBER | 1-1 | 1-2 | 1-3 |
| | | ROW-SIDE NUMBER | ROW COUNT + 1, ADD COLUMN ID | NONE | ROW COUNT + 1, ADD COLUMN ID |
| | | COLUMN-SIDE NUMBER | COLUMN COUNT + 1 | COLUMN COUNT = r+1 | NEW REGISTRATION |
| | ROW COUNT >= c | NUMBER | 2-1 | 2-2 | 2-3 |
| | | ROW-SIDE NUMBER | ROW COUNT = c+1 | ROW COUNT = c+1 | ROW COUNT = c+1 |
| | | COLUMN-SIDE NUMBER | NONE | COLUMN COUNT = r+1 | NONE |
| NOT COINCIDE | | NUMBER | 3-1 | 3-2 | 3-3 |
| ROW ADDRESS | | ROW-SIDE NUMBER | NEW REGISTRATION | NONE | NEW REGISTRATION |
| | | COLUMN-SIDE NUMBER | COLUMN COUNT + 1 | COLUMN COUNT = r+1 | NEW REGISTRATION |

FIG.31

|     | y0 | y1 | y2 | y3 | y4 | y5 | y6 |
|-----|----|----|----|----|----|----|----|
| x0  | 1  | 2  | 5  | 6  |    |    |    |
| x1  | 4  | 3  | 11 | 10 |    |    |    |
| x2  |    | 9  | 7  |    |    |    |    |
| x3  |    |    | 8  |    |    |    |    |
| x4  |    |    |    |    | 12 |    |    |
| x5  |    |    |    |    |    | 13 |    |
| x6  |    |    |    |    |    |    | 14 |

X0 TO X6 DENOTES ROW ADDRESS
Y0 TO Y6 DENOTES COLUMN ADDRESS

FIG. 32(A) DEFECT 1

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 1 | x0 | 0 | | 1 | y0 |
| | | | | | |
| | | | | | |
| | | | | | |
| | | | | | |
| | | | | | |

FIG. 32(B) DEFECT 2

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 2 | x0 | 0 | 1 | 1 | y0 |
| | | | | 1 | y1 |
| | | | | | |
| | | | | | |
| | | | | | |
| | | | | | |

FIG. 32(C) DEFECT 3

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 2 | x0 | 0 | 1 | 1 | y0 |
| 1 | x1 | 1 | | 2 | y1 |
| | | | | | |
| | | | | | |
| | | | | | |
| | | | | | |

FIG. 32(D) DEFECT 4

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 2 | x0 | 0 | 1 | 2 | y0 |
| 2 | x1 | 1 | 0 | 2 | y1 |
| | | | | | |
| | | | | | |
| | | | | | |
| | | | | | |

FIG. 32(E) DEFECT 5

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 2 | x1 | 1 | 0 | 2 | y1 |
| | | | | | |
| | | | | | |
| | | | | | |
| | | | | | |

FIG.33(A) DEFECT 6

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 2 | x1 | 1 | 0 | 2 | y1 |
|  |  |  |  |  |  |
|  |  |  |  |  |  |
|  |  |  |  |  |  |

FIG.33(B) DEFECT 7

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 2 | x1 | 1 | 0 | 2 | y1 |
| 1 | x2 | 2 |  | 1 | y2 |
|  |  |  |  |  |  |
|  |  |  |  |  |  |

FIG.33(C) DEFECT 8

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 2 | x1 | 1 | 0 | 2 | y1 |
| 1 | x2 | 2 |  | 2 | y2 |
| 1 | x3 | 2 |  |  |  |
|  |  |  |  |  |  |

FIG.33(D) DEFECT 9

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 2 | x1 | 1 | 0 | 3 | y1 |
| 1 | x2 | 2 |  | 2 | y2 |
| 1 | x3 | 2 |  |  |  |
|  |  |  |  |  |  |

FIG.33(E) DEFECT 10

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 3 | x1 | 1 | 0 | 3 | y1 |
| 1 | x2 | 2 |  | 2 | y2 |
| 1 | x3 | 2 |  |  |  |
|  |  |  |  |  |  |

FIG.34(A) DEFECT 11

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 3 | x1 | 1 | 0 | 3 | y1 |
| 1 | x2 | 2 | | 3 | y2 |
| 1 | x3 | 2 | | | |
| | | | | | |
| | | | | | |

FIG.34(B) DEFECT 12

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 3 | x1 | 1 | 0 | 3 | y1 |
| 1 | x2 | 2 | | 3 | y2 |
| 1 | x3 | 2 | | 1 | y4 |
| 1 | x4 | 3 | | | |
| | | | | | |

FIG.34(C) DEFECT 13

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 3 | x1 | 1 | 0 | 3 | y1 |
| 1 | x2 | 2 | | 3 | y2 |
| 1 | x3 | 2 | | 1 | y4 |
| 1 | x4 | 3 | | 1 | y5 |
| 1 | x5 | 4 | | | |

FIG.34(D) DEFECT 14

| ROW SIDE | | | | COLUMN SIDE | |
|---|---|---|---|---|---|
| ROW COUNT | ROW ADDRESS | COLUMN ID (1) | COLUMN ID (2) | COLUMN COUNT | COLUMN ADDRESS |
| 3 | x0 | 0 | 1 | 2 | y0 |
| 3 | x1 | 1 | 0 | 3 | y1 |
| 1 | x2 | 2 | | 3 | y2 |
| 1 | x3 | 2 | | 1 | y4 |
| 1 | x4 | 3 | | 1 | y5 |
| 1 | x5 | 4 | | | |

| DEFECT | PROCESSING NUMBER | NOTE |
|---|---|---|
| 1 | 3-3 | |
| 2 | 1-3 | |
| 3 | 3-1 | |
| 4 | 1-1 | |
| 5 | 2-3 | |
| 6 | 2-3 | |
| 7 | 3-1 | |
| 8 | 3-2 | |
| 9 | 1-2 | |
| 10 | 2-1 | |
| 11 | 2-2 | |
| 12 | 3-3 | |
| 13 | 3-3 | |
| 14 | 3-3 | UNRELIEVABLE |

DEVICES FOR STORING AND ACCUMULATING DEFECT INFORMATION, SEMICONDUCTOR DEVICE AND DEVICE FOR TESTING THE SAME

BACKGROUND OF THE INVENTION

1) Field of the Invention

The present invention relates to a technology for compression and storage of defect information necessary for judging whether a defective bit can be relieved by a redundant circuit in a semiconductor device.

2) Description of the Related Art

Apart from semiconductor memory cells, semiconductor devices are provided with redundant circuits in order to increase yield. Such redundant circuits comprise two kinds of preliminary memory cells: row and column. A defective bit occurring in the semiconductor memory cell is electrically replaced by the redundant circuit and relieved. Generally, a testing device for semiconductor devices compares expected readout value data of the semiconductor memory cell to be tested and actually read out data, and if the results do not agree with each other, it judges that there is a defective bit, and stores the defect information about the semiconductor memory cell. Then, the testing device performs relief analysis, using the redundant circuits provided preliminarily for relieving the defective bit, based on the defect information, to thereby perform relief determination, that is, determines if it is possible to replace all the defective bits with the redundant circuits. As described above, in order to perform the relief analysis for determining whether it is possible to relieve the defective bits of the semiconductor memory cell by the redundant circuits, it is necessary to temporarily accumulate the defect information of an address or the like detected in the test of the semiconductor memory cell by some methods.

At the time of accumulating the defect information, there has been heretofore used a memory for accumulation having a capacity the same as or larger than the capacity combining the semiconductor memory cell to be tested and the redundant circuits. However, with a recent increase of memory capacity, the memory for storing the defect information also increases in size, thereby causing a big problem in an increase of a hardware cost and an increase of time for the relief analysis. In order to solve these problems, various defect information accumulating methods capable of accumulating defect information in a small memory capacity has been sought.

One conventional technique of the defect information accumulating method capable of accumulating defect information in a small memory capacity is a defective bit relief analysis method for memory disclosed in Japanese Patent Application Laid-Open No. S59-207496. FIG. 37 and FIG. 38 are diagrams which show the defective bit data compression method of a semiconductor memory cell to be tested in this conventional technique. It is assumed that the semiconductor memory cell to be tested shown in FIG. 37 comprises two row redundant circuits and two column redundant circuits (not shown). A cross mark shown in the semiconductor memory cell to be tested shows the location of a defective bit, and it is assumed that a defective bit occurs in order of the number added to the defective bits. Every time a defective hit occurs, there are allocated row-address $x_1$, $x_2$, ... and column-address $y_1$, $y_2$, ... for a compressed data matrix, which is different from the absolute address in the semiconductor memory cell to be tested, but has clear correspondence with the absolute value, in the order of the occurrence. Then, as shown in FIG. 38, a flag is set at the relevant address on the matrix formed by the row-address and the column-address (displayed by black diagonal lines in FIG. 38). As a result, the compressed data matrix has data in a form that is rearranged in the address registered in order of occurrence of the defective bits. Further, it is compressed to a 4×4 matrix, without losing the relative relation information between the defective bits required for determining the redundant circuit which performs relief.

The compressed matrix which accumulates the defect information in this conventional technique is constructed so that the maximum defective bit data in the range in which the number of the defective bits occurred on the same address line does not exceed the number of redundant lines prepared on the symmetrical line side. That is, if it is assumed that the number of row redundant circuits is r, and the number of column redundant circuits is c, the compressed matrix becomes $\{(r \times c)+r\} \times \{(r \times c)+c\}$.

However, the above-described conventional technique provides defect information accumulating information including the minimum defect address information necessary for the relief analysis, but the number of defective bits existing on the same row address or the same column address are not counted. Hence, after preparing the compressed matrix by detecting the addresses of the respective defective bits, it is necessary to count the number of defective bits existing on the same row address or the same column address in the subsequent step in the relief analysis. That is, in the relief analysis, there is a step of counting the number of defective bits, thereby causing a problem in that much analysis time is required for judging whether it is possible to relieve the defective bit in the memory by the redundant circuit.

SUMMARY OF THE INVENTION

It is an object of this invention to provide a defect information storing device which can reducing the analysis time in the relief analysis of the semiconductor device. It is another object to provide a defect information accumulation processing device comprising the defect information storing device and executing a defect information accumulating method. It is a further object to provide a semiconductor device-testing device comprising the defect information storing device and a semiconductor device comprising the defect information storing device.

The defect information storing device according to one aspect of the present invention comprises r row redundant circuits and c column redundant circuits, and the address of a defective point, and the number of defective points existing on the row address and the column address are stored. As a result, the time required for the relief analysis of the semiconductor device can be shortened.

The defect information accumulation processing device according to another aspect of the present invention comprises the defect information storing device according to the present invention. In this defect information accumulation processing device, the defect information including the address of the detected defective point and the number of defective points existing on the row address or the column address of this defective point is stored in the defect information storing device.

In the defect information accumulating method according to still another aspect of the present invention, it is judged whether the address of the detected defective bit has already been stored. If not stored, the defect information of the detected defective point in a vacant line of the row-side or column-side defect information accumulating table is newly stored. If stored, the defect information stored in the line where the coinciding row address in the row-side defect information accumulating table, or in the line where the coinciding column address in the column-side defect information accumulating table, is updated.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 7 is a diagram which shows one example of the number of bits in the data stored in the defect information storing device, FIG. 12 is a diagram which shows the configuration of the defect information storing device corresponding to the semiconductor memory cell to be tested in FIG. 11, FIG. 13 is a diagram which displays in a matrix an address where a defective bit occurs, FIG. 14A through FIG. 14D are diagrams which show the procedure for storing the defect information of the defective bits in FIG. 13 in the defect information storing device, FIG. 15 is a flowchart which shows the operation processing for storing the defect information of defective bits in the defect information storing device, FIG. 16 is a diagram which displays in a matrix an address where a defective bit occurs, FIG. 17 is a diagram which shows the state that the defect information of the defective bits in FIG. 16 is stored in the defect information storing device, FIG. 18 is a diagram which displays in a matrix an address where a defective bit occurs, FIG. 19A through FIG. 19C are diagrams which show the procedure for storing the defect information of the defective bits in FIG. 18 in the defect information storing device, FIG. 20 is a diagram which displays in a matrix an address where a defective bit occurs, FIG. 21A through FIG. 21D are diagrams which show the procedure for storing the defect information of the defective bits in FIG. 20 in the defect information storing device, FIG. 22 is a diagram which displays in a matrix an address where a defective bit occurs, FIG. 23A through FIG. 23D are diagrams which show the procedure for storing the defect information of the defective bits in FIG. 22 in the defect information storing device, FIG. 27 is a block diagram which shows the configuration of the defect information accumulation processing device, FIG. 28 is a timing chart which shows detection processing of a defect address and write processing of the defect information in the defect information accumulation processing device in FIG. 27, FIG. 29 is a diagram which shows one example of a circuit constituting the defect information accumulation processing device in FIG. 27, FIG. 30 is a diagram which shows processing conditions of a defect information accumulating method, FIG. 31 is a diagram which displays in a matrix an address where a defective bit occurs, FIG. 32A through FIG. 32E are diagrams which show the procedure for storing the defect information of the defective bits in FIG. 31 in the defect information storing device (1), FIG. 33A through FIG. 33E are diagrams which show the procedure for storing the defect information of the defective bits in FIG. 31 in the defect information storing device (2), FIG. 34A through FIG. 34D are diagrams which show the procedure for storing the defect information of the defective bits in FIG. 31 in the defect information storing device (3)

DETAILED DESCRIPTIONS

Embodiments of the defect information storing device and the defect information accumulation processing device comprising this device, the defect information accumulating method, the semiconductor device-testing device comprising the defect information storing device and the semiconductor device comprising the defect information storing device according to this invention will be explained in detail, with reference to the accompanying drawings.

Figure 1:
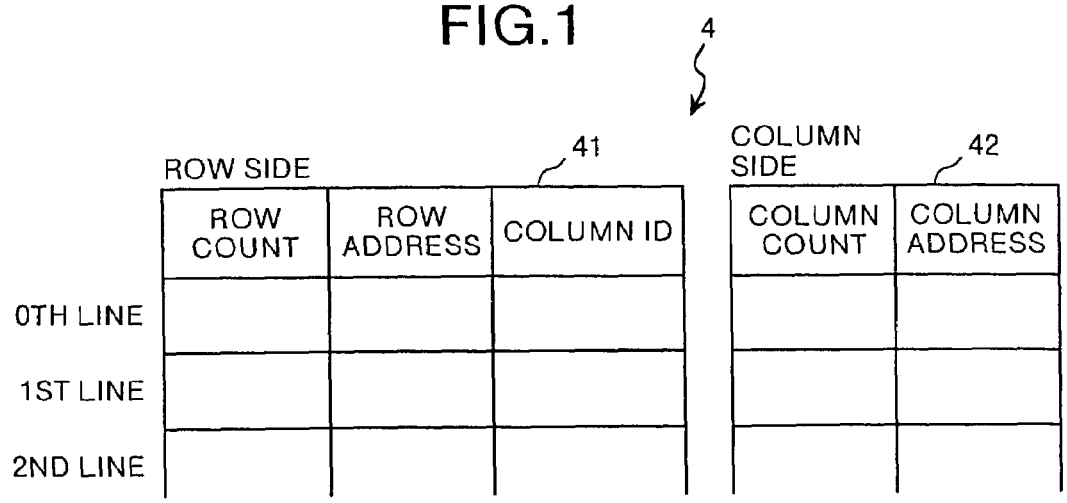
FIG. 1 is a diagram which shows a first embodiment of the configuration of the defect information storing device.

FIG. 1 is a diagram which shows a first embodiment of the configuration of the defect information storing device according to this invention. The defect information storing device 4 comprises a row-side defect information accumulating table 41 and a column-side defect information accumulating table 42, and these two tables are associated with each other. The row-side defect information accumulating table 41 comprises fields of "row count", "row address" and "column ID". The column-side defect information accumulating table 42 comprises fields of "column count" and "column address". Defect information means information including column address and row address of a defective bit, and the number of defective bits existing on these column and row addresses.

In the fields of "row address" and "column address", the row and column addresses where the defective bits exist are stored, and in the row-side defect information accumulating table 41, the row address of a defective bit is stored, and in the column-side defect information accumulating table 42, the column address of the defective bit is stored. In the field of "row count", there is stored the number of all defective bits having the same row address as the row address stored in the field of "row address". In the field of "column count", there is similarly stored the number of all defective bits having the same column address. In the field of "column ID", there is stored an identifier indicating where in the column-side defect information accumulating table 42, the column address of the defective bit stored in the field of "row address" in the row-side defect information accumulating table 41 is stored, that is, an ID number (identification number) defined in the column-side defect information accumulating table 42. In the example shown in FIG. 1, the first row in the data area in the defect information storing device 4 is defined as "0th row", the next row is defined as "1st row", the next row is defined as "2nd row", . . . , and the figure indicating which line in this column-side defect information accumulating table 42 corresponds to the "column ID". By this "column ID", the row-side defect information accumulating table 41 is associated with the column-side defect information accumulating table 42.

Figure 2:
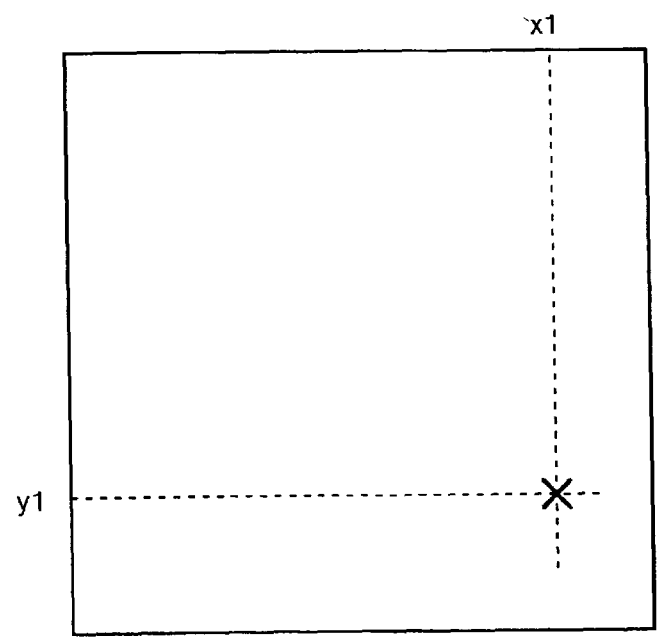
FIG. 2 is a diagram which shows occurrence of a defective bit on a semiconductor memory cell to be tested.

FIG. 2 is a diagram which shows the state that a defective bit has occurred in a semiconductor memory cell to be tested. In this specification, as shown in FIG. 2, when it is assumed that the lateral direction on the paper is x-axis, and a direction perpendicular to this x-axis on the paper is y-axis, the row address in the semiconductor memory cell to be tested corresponds to the coordinate on the x-axis, and the column address in the semiconductor memory cell to be tested corresponds to the coordinate on the y-axis.

The defective bit occurred in this semiconductor memory cell to be tested has x1 as the row address, and y1 as the column address. In this case, "1" is input in the "row count" of the 0th line in the row-side defect information accumulating table 41, and the row address of the defective bit, "x1", is input in the "row address". Further, "1" is input in the "column count" of the 0th line in the column-side defect information accumulating table 42, and the column address of the defective bit, "y1", is input in the "column address". Then, the column number "0" of the column-side defect information accumulating table 42 in which the column address of this defective bit is stored is input in the "column ID" of the 0th line of the row-side defect information accumulating table 41.

Figures 3, 4:
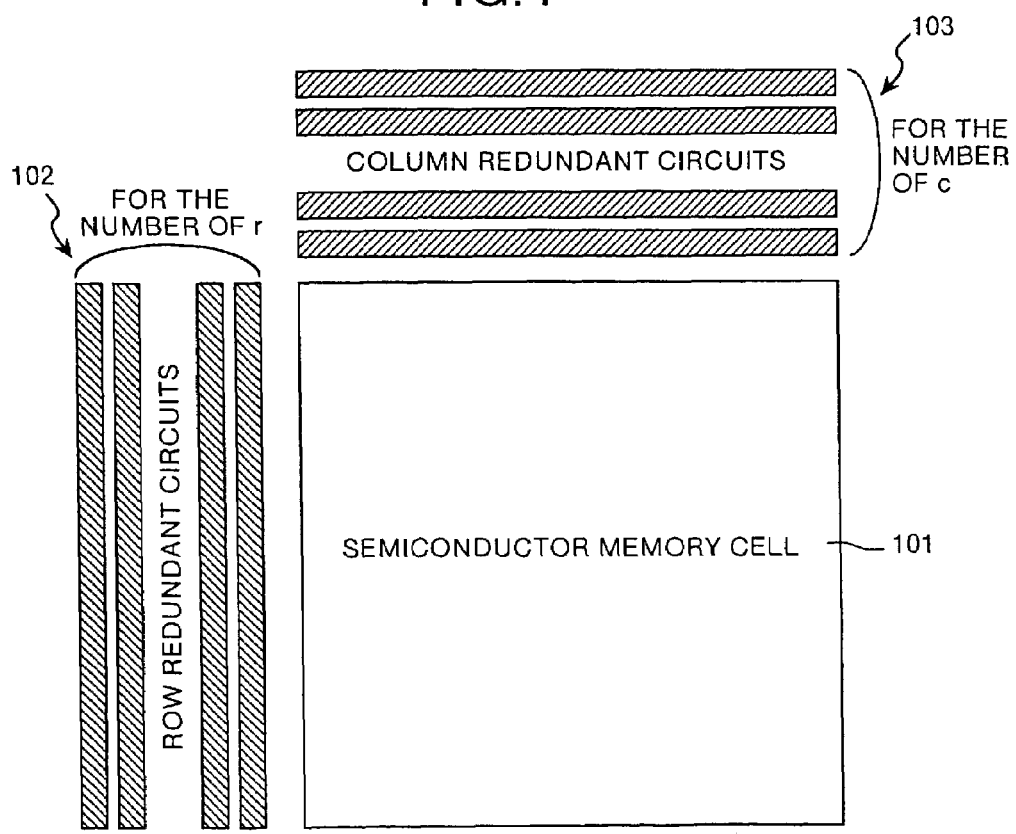
FIG. 3 is a diagram which shows an example in which defect information is stored in the defect information storing device.
FIG. 4 is a diagram which schematically shows the configuration of the semiconductor memory cell to be tested.

FIG. 3 is a diagram which shows the state that defect information including the address of the defective bit and the number of defective bits on the row address and the column address is stored in the defect information storing device 4. Other defective bits having the same row address or the same column address as the defective bit stored in the defect information storing device 4 do not exist. Therefore, the "row count" in the row-side defect information accumulating table 41 and the "column count" in the column-side defect information accumulating table 42 are both "1".

According to the first embodiment, the defect information storing device 4 which includes the number of defective bits existing on the same address as the row or column address of the defective bit, that is, the number of defect counts, as well as the address of the defective bit, can be realized.

A defect information storing device that is more generalized as compared to the defect information storing device 4 of the first embodiment will be explained here as a second embodiment.

Figure 5:
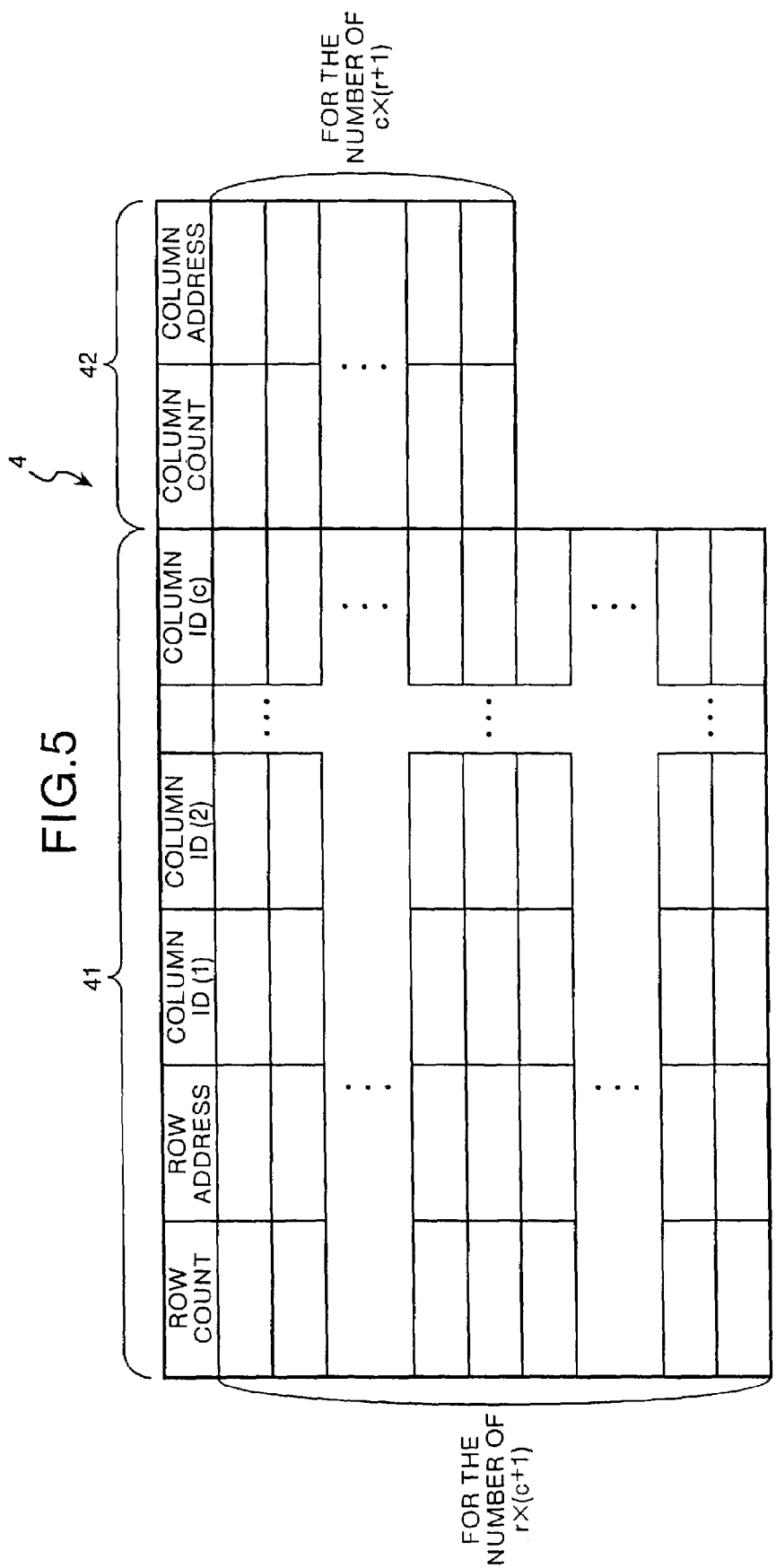
FIG. 5 is a diagram which shows a second embodiment of the configuration of the defect information storing device.

FIG. 4 is a diagram which shows the configuration of the semiconductor device and FIG. 5 is a diagram which shows the configuration of the defect information storing device 4 when it is a semiconductor device with the configuration of FIG. 4. The semiconductor device comprises a semiconductor memory cell 101, row redundant circuits 102 for the number of r, and column redundant circuits 103 for the number of c. When a defective bit exists in the semiconductor memory cell 101, it is possible to relieve the semiconductor device as if there is no defective bit in the semiconductor memory cell 101, by electrically replacing the row or column in which the defective bit exists by the row redundant circuit 102 or the column redundant circuit 103.

Generally, when the number of defective bits occurred on the same row or column address in the semiconductor memory cell 101 to be tested exceeds the number of redundant circuits prepared on the side of the symmetrical line (on the column side, when it is a defective bit on the same row address in the semiconductor memory cell 101 to be tested, and on the row side, when it is a defective bit on the same column address), it can be judged that the defective bits on the same row address or on the same column address in the semiconductor memory cell 101 to be tested can be relieved only by the row redundant circuit 102 or the column redundant circuit 103. Therefore, in this case, the row redundant circuit 102 is fixed with respect to the defective bit on the same row address in the semiconductor memory cell 101 to be tested, and the column redundant circuit 103 is fixed with respect to the defective bit on the same column address. Hence, the size (number of lines) of the defect information storing device 4 can be fixed, which can obtain data of defective bits to its maximum within the range in which the number of defective bits occurred on the same row address or the same column address does not exceed the number of redundant circuits prepared on the symmetrical line side.

That is, in the instance of row-side defect information accumulating table 41: $r(c+1)$ lines, and in the instance of column-side defect information accumulating table 42: $c(r+1)$ lines.

Further, as explained in the first embodiment, it is necessary to express the column address of other defective points existing on the same address as the field of "column ID", in the range that does not exceed the number "c" of the column redundant circuits 103, in addition to the two fields of "rowcount" and "column count", and hence the number of elements (number of fields) set in the row-side defect information accumulating table 41 should be "c". On the other hand, as explained in the first embodiment, the number of elements (number of fields) set in the column-side defect information accumulating table 42 is only 2, that is, "column count" and "column address". Therefore, the number of elements (number of fields) of the defect information storing device 4 becomes, in the instance of row-side defect information accumulating table 41: (2+c) elements, and in the instance of column-side defect information accumulating table 42: 2 elements.

In the defect information storing device 4 created from these, with respect to the semiconductor memory cell 101 having the configuration shown in FIG. 4, as shown in FIG. 5, the row-side defect information accumulating table 41 has a table configuration of (2+c) elements×r(c+1) lines, and the column-side defect information accumulating table 42 has a table configuration of 2 elements×c(r+1) lines. That is, in the row-side defect information accumulating table 41, it is set such that total (2+c) elements (fields) of "row count", "row address", "column ID (1)", "column ID (2)", . . . , and "column ID (c)" can store data for r(c+1) lines. Further, in the column-side defect information accumulating table 42, it is set such that total 2 elements (fields) of "column count" and "column address" can store data for c(r+1) lines.

"column ID (n) (n=1 to c)" indicates identifiers that associate the column address of a defective bit existing on the same row address as the "row address" stored in the same line as this "column ID (n)" with the data in the column-side defect information accumulating table 42. When there exists a plurality of defective bits having the same row address as the "row address" stored in the same line as the "column ID (n)", the data is stored in the "column ID (n)" for the number of the defective bits, and the number is stored in the field of "row count".

According to the second embodiment, the size of the defect information storing device 4 is made a minimum size necessary for the relief analysis, that is, such a size that the column number in the row-side information of the defective bit having the same row address does not exceed the number of the column redundant circuits 103. As a result, the size of the defect information storing device 4 can be made compact.

A method for determining the number of bits of each field to be stored in the defect information storing device 4, which is determined in the second embodiment, will be explained below as a third embodiment.

Figure 6:
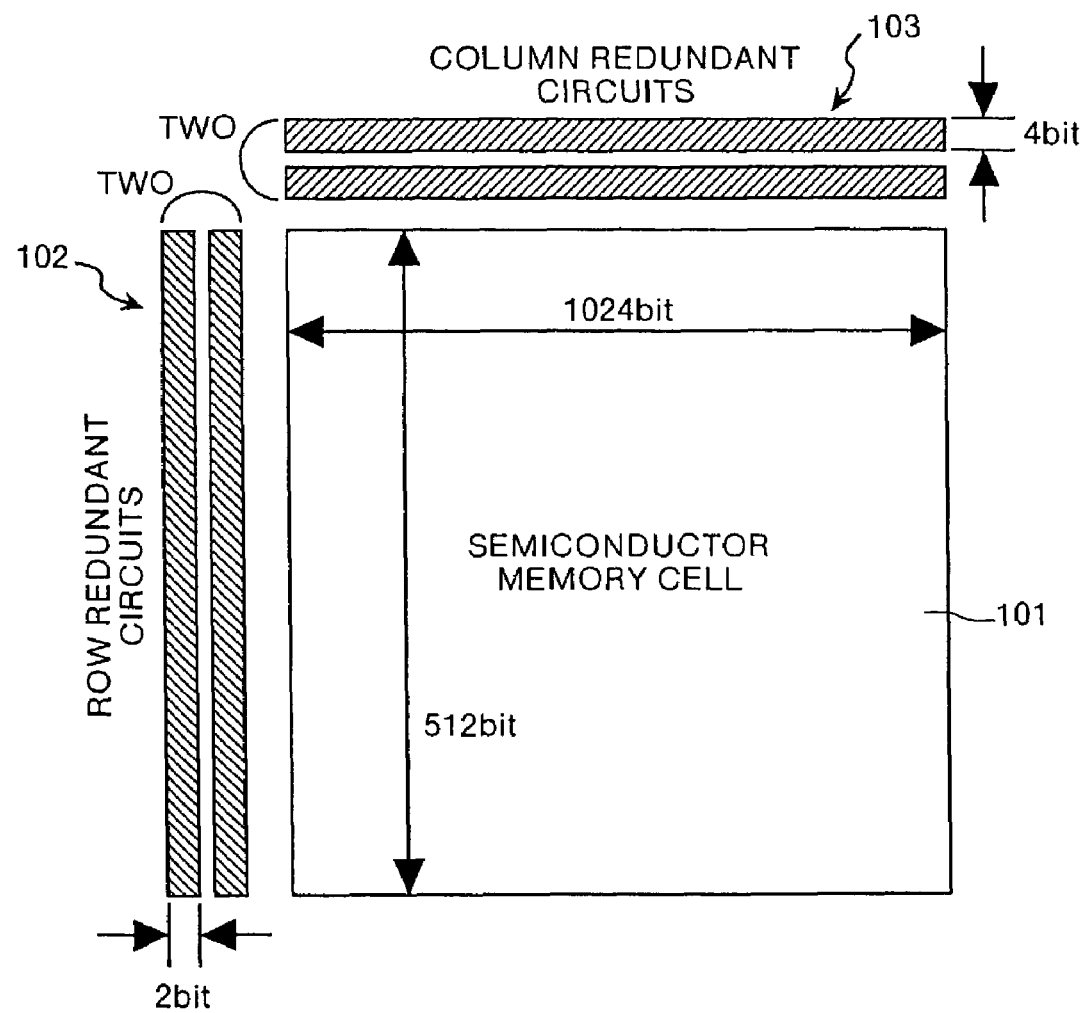
FIG. 6 is a diagram which shows an example of the configuration of the semiconductor memory cell to be tested.

FIG. 6 is a diagram which shows the configuration of the semiconductor device comprising two row redundant circuits 102 and two column redundant circuits 103 in the semiconductor memory cell 101. This semiconductor memory cell 101 has the number of bits of 512 bits in the row direction, and the number of bits of 1024 bits in the column direction. The bit width of one row redundant circuit 102 is 2 bits, and the bit width of one column redundant circuit 103 is 4 bits. The defect information storing device 4 created with respect to the semiconductor device is constituted of a row-side defect information accumulating table 41 having 6 lines×4 elements, and a column-side defect information accumulating table 42 having 6 lines×2 elements.

In this case, the number of bits necessary for storing defect information in the "row address" of the row-side defect information accumulating table 41 becomes 9 bits, since the value obtained by dividing the number of bits in the column direction of the semiconductor memory cell 101 by one bit width of the row redundant circuit 102 is $1024/2=512=2^9$. Similarly, the number of bits necessary for storing defect information in the "column address" of the column-side defect information accumulating table 42 becomes 7 bits, since the value obtained by dividing the number of bits in the row direction of the semiconductor memory cell 101 by one bit width of the column redundant circuit 103 is $512/4=128=2^7$.

The minimum number of bits necessary for storing a figure by binary notation in the "row count" of the row-side defect information accumulating table 41 becomes 2 bits, since $c+1=3<2^2$. Similarly, the minimum number of bits necessary for storing a figure by binary notation in the "column count" of the column-side defect information accumulating table 42 becomes 2 bits, since $r+1=3<2^2$.

Further, the maximum value stored in one element of "column ID (n)" of the row-side defect information accumulating table 41 is the number of lines in the column-side defect information accumulating table 42. Therefore, the minimum number of bits necessary for storing a figure by binary notation in the "column ID (n)" becomes 3 bits, since $c(r+1)=6<2^3$.

From the above, if the minimum number of bits of the defect information storing circuit necessary for the defect information storing device 4 is calculated, when the semiconductor memory cell 101 shown in FIG. 6 is to be tested, one line in the row-side defect information accumulating table 41 is (2+9+3×2) bits, which is stored for 6 lines, and one line in the column-side defect information accumulating table 42 is (2+7) bits, which is stored for 6 lines. Therefore, (2+9+3×2)×6+(2+7)×6=156 bits. FIG. 7 shows the configuration of the defect information storing device 4 in the instance of a semiconductor device which has the chip design shown in FIG. 6 created by the above method, and the maximum number of bits in the data stored in each area.

According to the third embodiment, the minimum number of bits necessary for the defect information storing device 4, which is necessary for the relief analysis of the semiconductor device, can be clarified.

A method of creating the defect information storing device 4, when the relief ranges of the column and row redundant circuits are different from each other will be explained below as a fourth embodiment.

Figure 8:
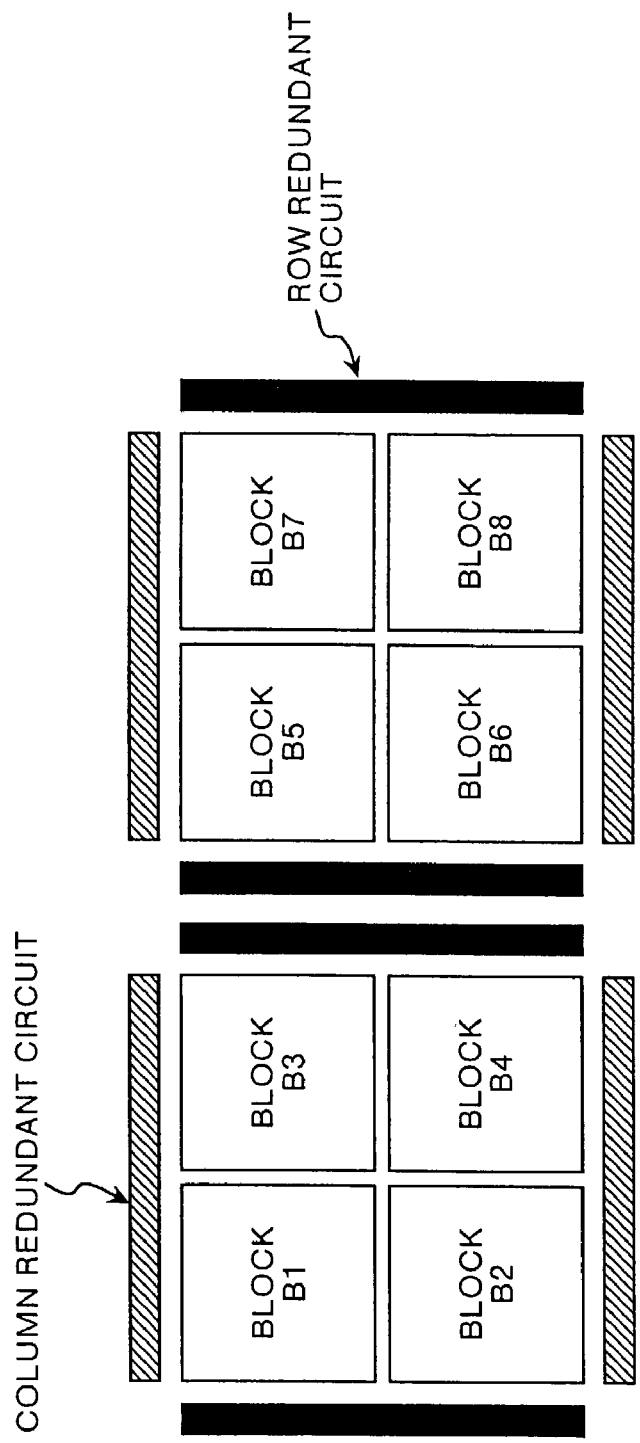
FIG. 8 is a diagram which shows an example of the configuration of a semiconductor chip having two semiconductor memory cells.

FIG. 8 is a diagram which shows the configuration of a semiconductor memory cell to be tested, in which the respective relief ranges of the row redundant circuit and the column redundant circuit are different from each other. In this fourth embodiment, when the range of the semiconductor memory cell which can be relieved by one redundant circuit is defined as a relief range, the defect information storing devices 4 are prepared for the number same as that of portions where the relief range of one row redundant circuit overlaps on the relief range of one column redundant circuit (this portion is hereinafter referred to as a block) formed on the chip.

For example, in the example shown in FIG. 8, the row redundant circuits and the column redundant circuits are respectively arranged at four places in one chip, and the row redundant circuit at one place has vertical two blocks as the relief range, and the column redundant circuit at one place has horizontal two blocks as the relief range. Thereby, the number of portions where the relief range of one row redundant circuit and the relief range of one column redundant circuit overlap on each other, that is, the number of blocks becomes 8. Therefore, in this semiconductor chip shown in FIG. 8, eight defect information storing devices 4 are prepared.

Figure 9:
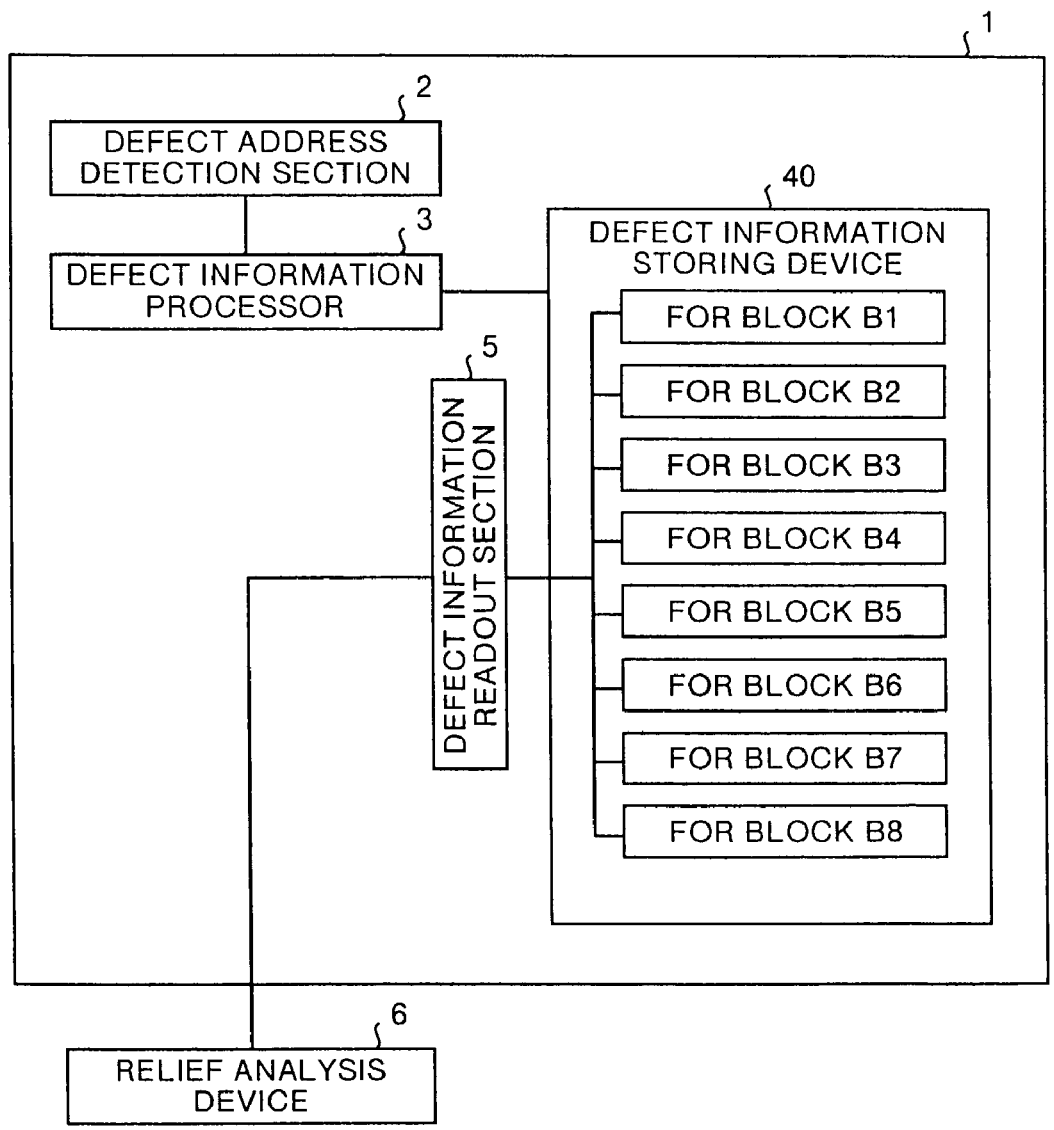
FIG. 9 is a block diagram which shows the configuration of a defect information accumulation processing device.

FIG. 9 is a block diagram which shows the configuration of a semiconductor device-testing device which has eight defect information storing section 40. This semiconductor device-testing device comprises, a defect information accumulation processing device 1 including, a defect address detection section 2 which detects an address of a defective bit in the semiconductor memory cell to be tested, the address of the detected defective bit, a defect information processor 3 which analyzes the number of defective bits on the same row or column address as that of the defective bit, defect information storing devices 4 which store defect information of the defective bit for each of blocks B1 to B8 of the semiconductor memory cell to be tested, and a defect information readout section 5 which can reading out the defect information with respect to each of the blocks B1 to B8 of the defect information storing devices 4, and a relief analysis device 6 which performs relief analysis of the semiconductor memory cell to be tested by performing relief judgment based on the defect information of the defect information storing devices 4. In the defect information storing devices 4 of the respective blocks B1 to B8, there are included a row-side defect information accumulating table 41 and a column-side defect information accumulating table 42. In this figure, the configuration is such that an area for storing the defect information for each of the blocks B1 to B8 is formed in the defect information storing devices 4.

The defect address detection section 2 detects a defective bit for each block. When the defect address detection section 2 detects an occurrence of the defective bit, the defect information processor 3 stores the defect information in the defect information storing device 4 of the corresponding block. The defect information readout section 5 has a function of selecting a defect information storing device 4 of an optional block by the instruction from the relief analysis device 6, to read out the defect information. That is, when the relief analysis of the semiconductor memory cell to be tested whose memory test has been finished is to be performed by the relief analysis device 6, the defect information accumulated in the defect information storing device 4 is read out to the outside by the defect information readout section 5, and based on this defect information, the relief analysis device 6 can perform the relief analysis.

According to the fourth embodiment, when the relief ranges of the row redundant circuit and the column redundant circuit are different from each other, the number of defect information storing devices 4 necessary for the relief analysis of the semiconductor memory cell is clarified, and based on this, the defect information storing devices 4 of the number required for a register, a memory or the like are created. Further, by ensuring a unit which accesses the created respective defect information storing device 4 from outside, transfer of information with the relief analysis device 6 is made possible.

A defect information accumulating method for accumulating defect information in the defect information storing device 4 shown in the above first to fourth embodiments will be specifically explained below as a fifth embodiment.

Figure 10:
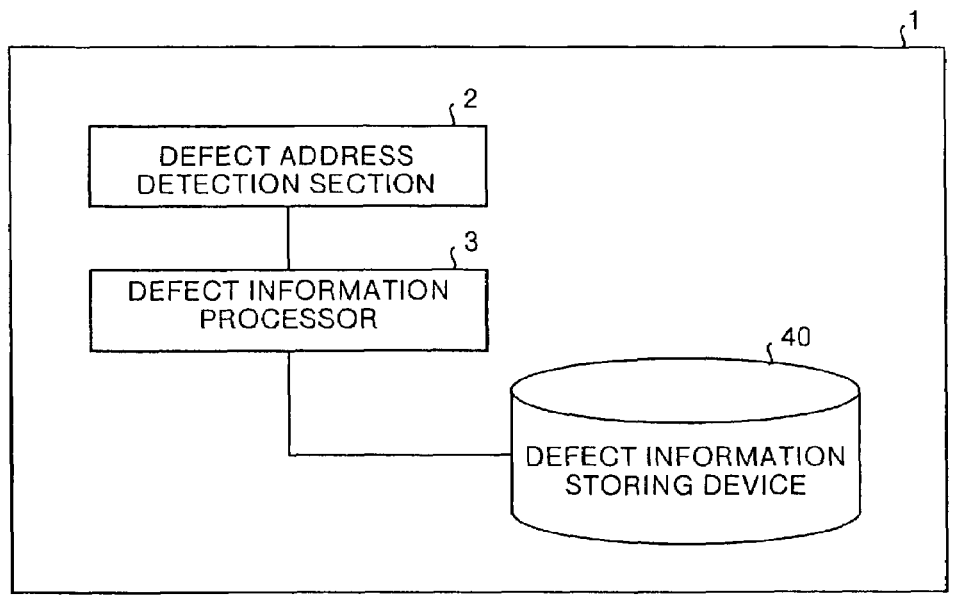
FIG. 10 is a block diagram which shows the configuration of a defect information accumulation processing device.

FIG. 10 is a block diagram which shows the configuration of a defect information accumulation processing device which has the defect information storing device 4 according to this invention. The defect information accumulation processing device 1 comprises, a defect address detection section 2 which detects an address of a defective bit in the semiconductor memory cell to be tested, the address of the detected defective bit, a defect information processor 3 which analyzes the number of defective bits on the same row or column address as that of the defective bit, and a defect information storing section 40 which is formed of a register or a memory, and stores defect information of the defective bit processed by the defect information processor 3. This defect information storing section 40 corresponds to the defect information storing device 4 in the above-described first to fourth embodiments.

Figure 11:
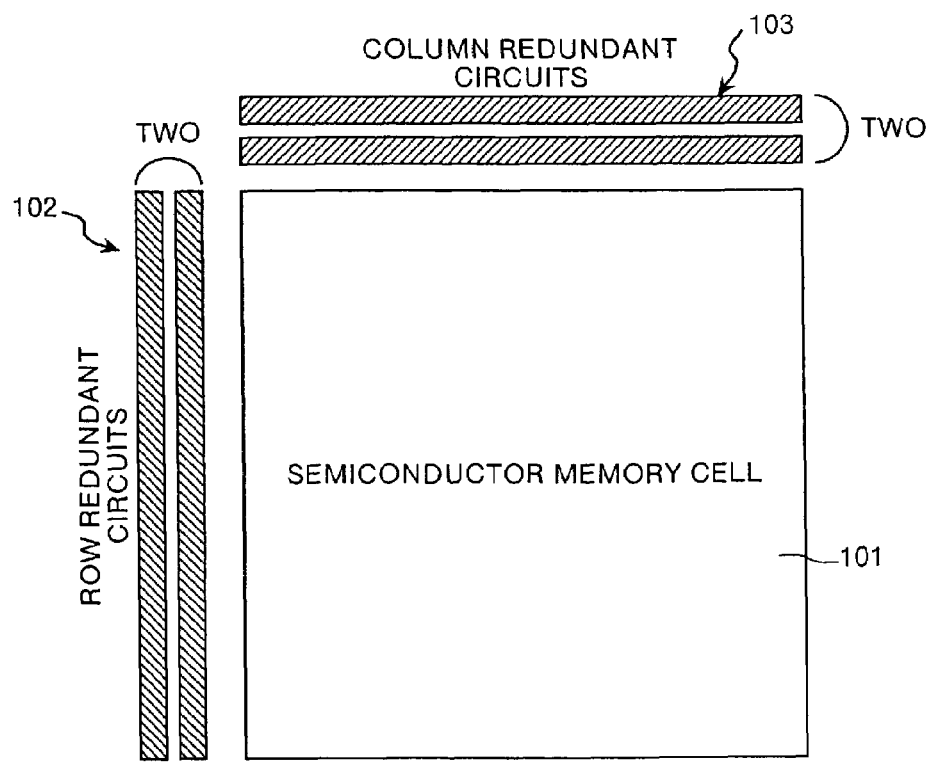
FIG. 11 is a diagram which schematically shows the configuration of the semiconductor memory cell to be tested.

FIG. 11 is a diagram which shows the configuration of the semiconductor device in which the defect information is accumulated by the defect information accumulating method according to this invention. FIG. 12 is a diagram which shows the configuration of the defect information storing device 4 determined by the configuration of the semiconductor device in FIG. 11. FIG. 13 is a diagram which displays in a matrix an address where a defective point occurs in the semiconductor device in FIG. 11. FIG. 14A through FIG. 14D are diagrams which show the process for storing the defect information in the defect information storing device 40 in FIG. 10. In FIG. 13, x0 to x4 denote row addresses, and y0 to y4 denote column addresses. The figure added on the matrix indicates that defective bits occur in order of addresses added with this figure.

The semiconductor device comprises a semiconductor memory cell 101 having a redundant configuration including two row redundant circuits 102 and two column redundant circuits 103, such that the relief ranges of these row redundant circuits 102 and column redundant circuits 103 coincide with each other. From the configuration of this semiconductor device, there is formed a defect information storing section 40 comprising a row-side defect information accumulating table 41 in which the number of elements is 2+c=4, and the number of lines is r×c+r=2×2+ 2=6, and a column-side defect information accumulating table 42 in which the number of elements is 2, and the number of lines is r×c+c=2×2+2=6. The number of elements of the "column ID (n)" in the row-side defect information accumulating table 41 becomes 2.

The operation processing procedure of the defect information into the defect information storing section 40 will now be explained, with reference to the flowchart in FIG. 15.

When a defective bit 1 occurs on the semiconductor memory cell 101 to be tested, and is detected by the defect address detection section 2 in the defect information accumulation processing device 1 (step S11: Yes), the defect information processor 3 obtains the address (x0, y0) of the defective bit 1 in the semiconductor memory cell 101 to be tested (step S12).

The defect information processor 3 judges whether there exists data having the same row or column address as the row or column address of the obtained defective bit 1 in the defect information storing section 40 (step S13).

In this example, since the defect information storing section 40 is in a vacant state, that is, since there is no defective bit already stored in the defect information storing section 40, which coincides with the row or column address equal to the address of the defective bit 1 (Step S13: No), "new registration of defect information" is carried out in a vacant line of the defect information storing section 40 (step S14). Specifically, as shown in FIG. 14A, the defect information processor 3 stores row count=1, row address=x0, and column ID (1)=0 in a vacant line, that is, 0th line in the row-side defect information accumulating table 41, and stores column count=1 and column address=y0 in a vacant line, that is, 0th line in the column side defect information accumulating table 42. Here, "0" stored in the "column ID (1)" in the row-side defect information accumulating table 41 indicates that column-side defect information (column address) of the defective bit 1 is stored in the 0th line of the column-side defect information accumulating table 42. However, in the column-side defect information accumulating table 42, the number of lines is counted by designating the first line as the 0th line, as described above.

Thereafter, control returns to step S11, and the defect information processor 3 judges whether occurrence of a defective bit is detected in the semiconductor memory cell 101 to be tested. In the example of FIG. 13, since a defective bit 2 occurs, the processing explained for the above-described steps S11 to S13 is executed by the defect information processor 3. That is, the defect information processor 3 obtains the address (x0, y1) of the defective bit 2, and judges whether a row or column address coinciding with the row or column address thereof already exists in the defect information storing section 40.

In this example, the row address x0 of the defective bit 2 coincides with the row address x0 stored in the 0th line of the row-side defect information accumulating table 41, but the column address y1 does not coincide with the column address stored in the column-side defect information accumulating table 42. Therefore, data having the same address as the defective bit 2 exists in the defect information storing section 40 (step S13: Yes), the row address coincides therewith (step S21: Yes), but the column address does not coincide (step S22: No). Hence, the defect information processor 3 stores the column-side defect information (column address) of the defective bit 2 in a vacant line of the column-side defect information accumulating table 42 (step S23). Thereafter, the defect information processor 3 adds "1" to the "row count" of the line having the same row address as the row address x0 of the defective bit 2 in the row-side defect information accumulating table 41, and stores the column ID stored at step S23 in a vacant field of the "column ID (2)" (step S24). FIG. 14B shows the state in which new registration of the defective bit information in the column-side defect information accumulating table 42 and update of the defective bit information in the row-side defect information accumulating table 41 have been performed in this manner.

Thereafter, control returns to step S11, and the defect information processor 3 judges whether an occurrence of a defective bit in the semiconductor memory cell 101 to be tested is detected. In the example shown in FIG. 13, since a defective bit 3 occurs, the processing explained for the above-described steps S11 to S13 is executed by the defect information processor 3. That is, the defect information processor 3 obtains the address (x1, y0) of the defective bit 3, and judges whether a row or column address coinciding with the row or column address thereof already exists in the defect information accumulating table.

In this example, the row address x1 of the defective bit 3 does not coincide with the row address stored in the row-side defect information accumulating table 41, but the column address y1 coincides with the column address y0 stored in the 0th line of the column-side defect information accumulating table 42. Therefore, data having the same address as the defective bit 3 exists in the defect information storing section 40 (step S13: Yes), but since the row address does not coincide therewith (step S21: No), the defect information processor 3 adds "1" to the "column count" of the line having the same column address as the column address y0 of the defective bit 3 in the column-side defect information accumulating table 42 (step S31), and stores the row address of the defective bit 3 in a vacant line of the row-side defect information accumulating table 41 and the line number (that is, column ID) in which the defect information has been updated in the column-side defect information accumulating table 42 at step S31, (step S32) FIG. 14C shows the state in which new registration of the defect information in the row-side defect information accumulating table 41 and update of the defect information in the column-side defect information accumulating table 42 have been performed in this manner.

Thereafter, control returns to step S11, and the defect information processor 3 judges whether an occurrence of a defective bit in the semiconductor memory cell 101 to be tested is detected. In the example shown in FIG. 13, since a defective bit 4 occurs, the processing explained for the above-described steps S11 to S13 is executed by the defect information processor 3. That is, the defect information processor 3 obtains the address (x1, y1) of the defective bit 4, and judges whether a row or column address coinciding with the row or column address thereof already exists in the defect information storing section 40.

In this example, the row address x1 of the defective bit 4 coincides with the row address x1 stored in the first line of the row-side defect information accumulating table 41, and the column address y1 coincides with the column address y1 stored in the first line of the column-side defect information accumulating table 42. Therefore, data having the same address as that of the defective bit 4 exists in the defect information storing section 40 (step S13: Yes), the row address coincides therewith (step S21: Yes), and the column address coincides therewith (step S22: Yes). Therefore, the defect information processor 3 adds "1" to the "column count" of the line in which the same column address as the column address y1 of the defective bit 4 in the column-side defect information accumulating table 42 is stored (step S41). Further, the defect information processor 3 adds "1" to the "row count" of the line in which the same row address as the row address x1 of the defective bit 4 in the row-side defect information accumulating table 41 is stored, and stores the line number (that is, column ID) in which the addition processing has been performed at step S41 in a vacant field of the "column ID (n)", that is in this case, in "column ID (2)" (step S24). FIG. 14D shows the state in which update of the defective bit information in the row-side defect information accumulating table 41 and the column-side defect information accumulating table 42 have been performed in this manner.

Thereafter, control returns to step S11, and the defect information processor 3 judges whether an occurrence of a defective bit in the semiconductor memory cell 101 to be tested is detected. In the example shown in FIG. 13, since no other defective bit exists, the processing for storing information of defective bit in the defect information storing section 40 is finished.

As explained above, in the fifth embodiment, the row and column addresses of the defective bit occurred in the semiconductor memory cell 101 to be tested are compared with the row and column addresses of the defective bit already accumulated in the defect information storing section 40, and the following processing is carried out, (1) Re Row Address of the Defective Bit (1-1) When the row address of the defective bit does not coincide with the row address accumulated in the row-side defect information accumulating table 41, "New registration of defect information" into the row-side defect information accumulating table 41 is performed. That is, the row count, the row address and the column ID are input in a vacant line of the row-side defect information accumulating table 41.

(1-2) When the row address of the defective bit coincides with the row address accumulated in the row-side defect information accumulating table 41, "Update of defect information" of the row-side defect information accumulating table 41 is performed. That is, "1" is add to the row count of the line in which the defect information relating to the same row address as that of the defective bit is stored, and the column ID is input.

(2) Re Column Address of the Defective Bit (2-1) When the column address of the defective bit does not coincide with the column address accumulated in the column-side defect information accumulating table 42, "New registration of defect information" into the column-side defect information accumulating table 42 is performed. That is, the column count and the column address are input in a vacant line of the column-side defect information accumulating table 42.

(2-2) When the column address of the defective bit coincides with the column address accumulated in the column-side defect information accumulating table 42, "Update of defect information" of the column-side defect information accumulating table 42 is performed. That is, "1" is add to the column count of the line in which the defect information relating to the same column address as that of the defective bit is stored.

According to the fifth embodiment, there can be provided a defect information accumulating method for storing the defect information including the point of occurrence of a defective bit, as well as the number of defect counts of the row and the column, in a compact manner.

In the above-described fifth embodiment, an example in which the number of occurrence of defective bits in the semiconductor memory cell 101 to be tested does not exceed the capacity (number of lines) of the defect information storing section 40 has been explained. A defect information accumulating method when the number of occurrence of defective bits exceeds the capacity (number of lines) of the defect information storing section 40 will be explained below as a sixth embodiment.

Here, as in the fifth embodiment, an example in which the defect information of the semiconductor memory cell 101 to be tested having the redundant configuration as shown in FIG. 11 is stored by the defect information accumulation processing device 1 shown in FIG. 10 will be explained. FIG. 16 is a diagram which displays in a matrix an address of a defective bit occurring in the semiconductor memory cell 101 to be tested shown in FIG. 11, and the figures in FIG. 16 indicate the order in which a defective bit occurs.

The defect information of defective bits 1 to 6, which occur in the semiconductor memory cell 101 to be tested as shown in FIG. 16, is stored in the defect information storing section 40, and the procedure is the same as that of the above-described fifth embodiment, and hence the explanation thereof is omitted. The maximum number of defect information that can be stored in the defect information storing section 40 is 6. As is clear from FIG. 16, a defective bit in which the row or column address coincides with each other does not exist in the defective bits 1 to 6. Therefore, at the time when the defect information of the row and column of the defective bit 6 is stored in the defect information storing section 40, the defect information storing section 40 is filled with the defect data, and no vacant line exists. That is, as shown in FIG. 17, all lines constituting the row-side defect information accumulating table 41 and all lines constituting the column-side defect information accumulating table 42 in the defect information storing section 40 are filled to capacity by the defect information of the defective bits 1 to 6.

Thereafter, a defective bit 7 occurs, and is detected by the defect address detection section 2 of the defect information accumulation processing device 1. The defect information processor 3 obtains the address of the detected defective bit 7. However, since the row and column addresses of this defective bit 7 are different from any row and column addresses of the defective bits already accumulated in the defect information storing section 40, it is necessary to perform"new registration of defect information". As shown in FIG. 17, however, since there is no vacant line both in the row-side defect information accumulating table 41 and the column-side defect information accumulating table 42, the defect information of the defective bit 7 cannot be stored in the defect information storing section 40.

As described above, when there is no vacant line for performing "new registration of defect information" in either of the row-side defect information accumulating table 41 and the column-side defect information accumulating table 42, and a defective bit occurs in the semiconductor memory cell 101 to be tested, it is judged by the defect information processor 3 that the defective bit cannot be relieved. Then, the storing processing of the defect information of the defective bit into the defect information storing section 40 in the semiconductor memory cell 101 to be tested is finished here. For example, one-bit register is provided in the defect information accumulation processing device 1, and whether it is possible to relieve the defective bit in the semiconductor memory cell 101 to be tested can be stored therein. In this case, by defining such that "0" means relievable, and "1" means unrelievable (or may be opposite), it becomes possible to smoothly carry out the processing of relief analysis to be performed in the subsequent step.

According to the sixth embodiment, by defining that it is unrelievable when the number of occurrence of defective bits in the semiconductor memory cell 101 to be tested exceeds the capacity of the defect information storing section 40, the size of the defect information storing section 40 can be suppressed to the minimum size necessary for the relief analysis of the defective bits.

In a seventh embodiment, when a defect which can be relieved only by the row or column redundant circuit occurs, the operation for accumulating the defect information in the defect information storing section 40 is limited, to thereby provide a defect information accumulating method for limiting the size of the defect information storing section 40 to the minimum size necessary for the relief analysis of the defective bits.

As in the fifth embodiment, an example in which defect information of the semiconductor memory cell 101 to be tested having the redundant configuration shown in FIG. 11 is accumulated by the defect information accumulation processing device 1 shown in FIG. 10 will be explained.

FIG. 18 is a diagram which displays in a matrix an address of a defective bit which occurs in the semiconductor memory cell 101 to be tested shown in FIG. 11, and the order of figures in FIG. 18 indicate the order of occurrence of defective bits. There is shown an example in which three defective bits 1 to 3 occur side by side on the same column address. FIG. 19A through FIG. 19C are diagrams which show a process for storing the defect information in the defect information storing device 40, when defective bits shown in FIG. 18 occur.

The processing for storing the defect information of up to defective bit 2 in FIG. 18 in the defect information storing section 40 of the defect information accumulation processing device 1 is the same as that of the fifth embodiment. That is, since a defective bit 1 is the first defective bit, as shown in FIG. 19A, the row and column addresses are stored in the defect information storing section 40. The column address of the defective bit 2 is the same as the column address of the defective bit 1, and hence as shown in FIG. 19B, the defect information processor 3 adds "1" to the "column count" of the line where the same column address as that of the defective bit 2 is stored in the column-side defect information accumulating table 42 (that is, the 0th line), to carry out the update processing, and stores the row address of the defective bit 2 in a vacant line of the row-side defect information accumulating table 41.

Thereafter, when a defective bit 3 occurs, defective bits are lined up in the column direction, which are larger than the number of the row redundant circuits 102 (two in the example of FIG. 11). In this case, it is physically impossible to relieve three defective bits 1 to 3 having different row addresses on the same column address by two row redundant circuits 102. But since the defective bits 1 to 3 have the same column address, these are surely relieved by the column redundant circuits 103. The defect information of the defective bits in which the defective bits having the same column address exceed the number of the row redundant circuits 102 has already been determined by the row redundant circuits 102 which relieves these defective bits, and hence this defect information is not necessary in the subsequent step of other relief analysis.

As described above, when the defective bits having the same column address occur more than the number of the row redundant circuits 102, even if the defect information on the row side relating to the defective bit which has occurred more than the number of the row redundant circuits 102 is not accumulated, there is no problem. Therefore, as shown in FIG. 19C, when a defective bit 3 occurs, which has the same column address as that of the two or more defective bits which have already occurred, the defect information processor 3 updates only the column-side defect information accumulating table 42 (that is, adds "1" to the "column count" corresponding to the column address of the defective bit 3), and it is not necessary to perform the new registration processing of the row address of the defective bit 3, with regard to the row-side defect information accumulating table 41.

The above processing can be generalized for semiconductor memory cells having row redundant circuits for the number of r and column redundant circuits for the number of c as described below. That is, when the column address of the generated defective bit coincides with the column address in the column-side defect information accumulating table 42, and the "column count" is larger than the number "r" of the row redundant circuits, and the row address of the generated defective bit does not coincide with the row address in the row-side defect information accumulating table 41, or when the address of the generated defective bit coincides with the row address in the row-side defect information accumulating table 41, and the "rowcount" is less than the number "c" of the column redundant circuits, then the defect information processor 3 performs only the processing for adding "1" to the "column count" of the line where the defect information relating to the column address of the defective bit in the column-side defect information accumulating table 42 is stored, and does not execute the new registration processing or the update processing of the defect information relating to the row address of the defective bit with respect to the row-side defect information accumulating table 41.

By providing such a rule, when a defective bit having the same column address occurs, which exceeds the number of the row redundant circuits, in the semiconductor memory cell to be tested, the defect information relating to the row address of the defective bit is not stored. As a result, the defect information that can be stored in the defect information storing section 40 can be made a necessity minimum.

The processing method when a defect, which can be relieved only by the column redundant circuits 103, occurs has been heretofore explained. Next, a processing method when a defect, which can be relieved only by the row redundant circuits 102, occurs will be explained. In this case, as in the above explanation, an example in which defect information of the semiconductor memory cell 101 to be tested having the redundant configuration shown in FIG. 11 is stored by the defect information accumulation processing device 1 shown in FIG. 10 will be explained. FIG. 20 is a diagram which displays in a matrix an address where a defective bit occurs in the semiconductor memory cell 101 to be tested shown in FIG. 11, and the figures in FIG. 20 indicate the order of occurrence of defective bits. Here, there is shown an example in which three defective bits 1, 2 and 4, of four defective bits 1 to 4, occur side by side on the same row address. FIG. 21A through FIG. 21D are diagrams which show the procedure for storing the defect information in the defect information storing device 40, when defective bits shown in FIG. 20 occur.

The processing for storing the defect information of up to defective bit 3 in FIG. 20 in the defect information storing section 40 is the same as that of the fifth embodiment. That is, since a defective bit 1 is the first defective bit, as shown in FIG. 21A, the row and column address (x0, y0) is stored in the defect information storing section 40. The row address x0 of the defective bit 2 is the same as the row address x0 of the defective bit 1, and hence as shown in FIG. 21B, the defect information processor 3 updates the "row count" of the line having the same row address as the row address x0 of the defective bit 2 in the row-side defect information accumulating table 41, and stores the column address y1 of the defective bit 2 in a vacant line of the column-side defect information accumulating table 42. Since the defective bit 3 has the row and column address (x1, y2) that does not coincide with the row and column address already stored in the defect information storing section 40, as shown in FIG. 21C, the row and column address (x1, y2) is newly registered in the row-side defect information accumulating table 41 and the column-side defect information accumulating table 42.

Thereafter, when a defective bit 4 occurs, defective bits are lined up in the row direction, which are larger than the number of the column redundant circuits 103 (two in the example of FIG. 11). In this case, it is physically impossible to relieve three defective bits 1, 2 and 4 having different column addresses on the same row address by two column redundant circuits 103. But since the defective bits 1, 2 and 4 have the same row address, these are surely relieved by the row redundant circuits 102. The defect information of the defective bits in which the defective bits having the same row address exceed the number of the column redundant circuits 103 has already been determined by the column redundant circuits 103 which relieves these defective bits, and hence this defect information is not necessary in the subsequent step of other relief analysis.

As described above, when the defective bits having the same row address occur more than the number of the column redundant circuits 103, even if the column-side defect information relating to the defective bit is not accumulated, there is no problem. Therefore, as shown in FIG. 21D, when a defective bit 4 occurs, which has the same row address as that of two or more defective bits which have already occurred, the defect information processor 3 updates only the row-side defect information accumulating table 41 (that is, adds "1" to the "row count" of the line where the same row address as that of the defective bit 4 is stored), and does not execute the new registration processing of the column address of the defective bit 4, with respect to the column-side defect information accumulating table 42.

The above processing can be generalized for semiconductor memory cells having row redundant circuits for the number of r and column redundant circuits for the number of c as described below. That is, when the row address of the generated defective bit coincides with the row address in the row-side defect information accumulating table 41, and the "row count" is larger than the number "c" of the column redundant circuits, and the column address of the generated defective bit does not coincide with the address in the column-side defect information accumulating table 42, or when the column address of the generated defective bit coincides with the address in the column-side defect information accumulating table 42, and the "column count" is less than the number "r" of the row redundant circuits, then the defect information accumulation processing device 1 performs only the processing for adding "1" to the "row count" of the line where the defect information relating to the defective bit in the row-side defect information accumulating table 41 is stored, and does not execute the new registration processing or the update processing of the defect information relating to the column address of the defective bit with respect to the column-side defect information accumulating table 42.

By providing such a rule, when defective bits having the same row address of a number exceeding the number of the column redundant circuits 103 occur, the defect information relating to the column address of the defective bits is not accumulated. Therefore, the defect information that can be stored in the defect information storing section 40 can be made a necessity minimum.

According to the seventh embodiment, by suppressing the defect information of defective bits accumulated in the defect information storing section 40 to minimum amount necessary for relief analysis, the size of the memory or register required for storing the defect information can be suppressed. Further, since unnecessary defect information accumulating operation is not performed, the defect information accumulating algorithm can be simplified.

In an eighth embodiment, a more compact defect information accumulating method is provided, by limiting the number of defective bits on the same address which are stored in the defect information storing section 40 ("row count" and "column count" in the defect information storing section 40) to a size of necessity minimum, at the time of using it for the relief analysis of the defective bits.

As in the fifth embodiment, an example in which defect information of the semiconductor memory cell 101 to be tested having the redundant configuration shown in FIG. 11 is accumulated by the defect information accumulation processing device 1 shown in FIG. 10 will be explained. FIG. 22 is a diagram which displays in a matrix an address of a defective bit which occurs in the semiconductor memory cell 101 to be tested shown in FIG. 11. Figures in FIG. 22 indicate the order of occurrence of defective bits. Here, there is shown an example in which four defective bits 1 to 4 occur side by side on the same column address. FIG. 21A through FIG. 21D are diagrams which show a process for storing the defect information in the defect information storing device 40, when defective bits 1 to 4 shown in FIG. 22 occur.

The processing for storing the defect information of up to defective bit 3 in FIG. 22 in the defect information storing section 40 is the same as that of the seventh embodiment. That is, since a defective bit 1 is the first defective bit, as shown in FIG. 23A, the row and column address (x0, y0) is stored in the defect information storing section 40. The column address y0 of the defective bit 2 is the same as the column address y0 of the defective bit 1, and hence as shown in FIG. 23B, the defect information processor 3 updates the "column count" in the column-side defect information accumulating table 42, and stores the row address x1 of the defective bit 2 in a vacant line of the row-side defect information accumulating table 41. Further, since the column address y0 of the defective bit 3 is the same as the column address y0 of the defective bits 1 and 2, and the number of the row redundant circuits 102 is two, the defect information processor 3 judges that the defective bits 1 to 3 cannot be relieved by the row redundant circuits 102. Therefore, the defective bits 1 to 3 can be relieved only by the column redundant circuits 103, and as shown in FIG. 23C, the update processing for adding "1" to the "column count" in the column-side defect information accumulating table 42 is carried out. However, the new registration of the defect information corresponding to the row address x2 of the defective bit 3 to the row-side defect information accumulating table 41 is not carried out.

Thereafter, a defective bit 4 detected by the defect address detection section 2 has the same column address y0 as that of the defective bits 1 to 3, but a different row address. That is, the defective bit 4 exists on the same column as the defective bits 1 to 3. Here, the "column count" of the line having the same column address y0 as that of the defective bit 4 in the column-side defect information accumulating table 42 in FIG. 23C is "3". This means that the defective bits (defective bits 1 to 3) having the column address y0 can be relieved only by the column redundant circuits 103. Therefore, a defective bit having the same column address as that of the defective bits 1 to 3 after the defective bit 4 is relieved by the same column redundant circuit 103 as the column redundant circuit 103 used for the defective bits 1 to 3.

Therefore, in such a case, if the defective bits having the same column address are 3 or more, these defective bits are relieved by the same column redundant circuit 103, regardless of the number thereof. Hence, there is no problem even if the upper limit of the numerical value stored in the "column count" in the column-side defect information accumulating table 42 is made 3. Therefore, even if the defective bit 4 having the same column address y0 as that of the defective bits 1 to 3 occurs, it is not necessary to update the "column count" of the column-side defect information accumulating table 42 to 4, and hence the new registration or update processing of the defect information relating to the defective bit 4 in the row-side defect information accumulating table 41 is not required. As a result, even if the occurrence of the defective bit 4 having the same column address y0 as that of the defective bits 1 to 3 having occurred previously is detected, as shown in FIG. 23D, the content of the defect information storing section 40 is not updated, and has the same content as the state when the defective bit 3 has occurred and the content thereof is updated.

In the above explanation, an example in which four or more defective bits having the same column address have occurred has been explained. However, even if four or more defective bits having the same row address have occurred in the semiconductor memory cell 101 to be tested, the similar processing is possible.

If the above-described processing is applied to a semiconductor device which has row redundant circuits for the number of r and column redundant circuits for the number of c, the situation is as described below. That is, even if a plurality of defective bits having the same row or column address have occurred in the semiconductor memory cell 101, the upper limit of the value stored in the "row count" corresponding to one row address in the row-side defect information accumulating table 41 is designated as c+1, and the upper limit of the value stored in the "column count" corresponding to one column address in the column-side defect information accumulating table 42 is designated as r+1. By providing such a rule, when defective bits of a number exceeding the number of the column redundant circuits 103 occur on the same column address, or when defective bits of a number exceeding the number of the row redundant circuits 102 occur on the same row address, accumulation of the defect information of these defective bits can be omitted.

According to the eighth embodiment, the number of the "row count" or the "column count" of the defective bits to be accumulated is suppressed to a number of necessity minimum at the time of the relief analysis, to thereby suppress the size of the memory or register required for accumulating the defect information.

Figures 24, 25, 26:
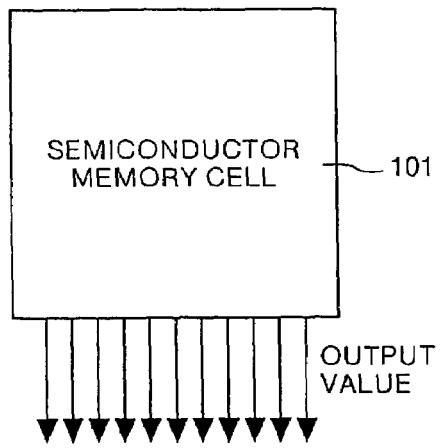
FIG. 24 is a diagram which schematically shows the configuration of the semiconductor memory cell to be tested.
FIG. 25 is a diagram which displays in a matrix an address where a defective bit occurs.
FIG. 26 is a diagram which shows the state that the defect information of the defective bits in FIG. 25 is stored in the defect information storing device.

FIG. 24 is a diagram which schematically shows the semiconductor memory cell 101 to be tested. In the test of the row address having this memory 101, an output value may be generated at the same time in a plurality of output signals. In view of a situation of accumulating the defect information, this means that a plurality of defective bits having the row address and an optional column address have occurred at the same time. Therefore, in this ninth embodiment, a defect information accumulating method is provided when the defective bits having occurred at the same time in the semiconductor memory cell 101 require to be relieved by the column redundant circuits 103 of at least c+1.

As in the fifth embodiment, an example in which defect information of the semiconductor memory cell 101 to be tested having the redundant configuration shown in FIG. 11 is accumulated by the defect information accumulation processing device 1 shown in FIG. 10 will be explained. FIG. 25 is a diagram which displays in a matrix an address of a defective bit which occurs in the semiconductor memory cell 101 to be tested shown in FIG. 11, and the figures in FIG. 25 indicate the order of occurrence. Here, there is shown an example in which three defective bits 1 to 3 occur side by side on the same row address x0. FIG. 26 is a diagram which shows a process for storing the defect information in the defect information storing device 40, when defective bits occur as shown in FIG. 25.

The defective bits 1 to 3 in FIG. 25 have occurred at the same time on the same row address x0, but these defective bits 1 to 3 exceed 2, which is the number of the column redundant circuits 103. Therefore, it is impossible to relieve these defective bits 1 to 3 by the column redundant circuits 103, and can be relieved only by the row redundant circuits 102. Therefore, as shown in FIG. 26, in the defect information storing section 40, "x0" is input in the "row address" of a vacant line in the row-side defect information accumulating table 41, and "3" is input in the "row count". There will be no problem, even if new registration processing relating to the defect information of these defective bits 1 to 3 is not carried out with respect to the column-side defect information accumulating table 42.

Also, when four or more defective bits having the same row address occur at the same time, the processing of the row-side defect information accumulating table 41 needs only to be carried out similarly. However, the maximum of the value stored in the "row count" of the row-side defect information accumulating table 41 is set to "3", which is a figure obtained by adding "1" to the number of the row redundant circuits 102. This is because, as explained in the eighth embodiment, if the "row count" of a certain row address is "3", it means that these defective bits can be relieved only by the row redundant circuits 102.

If the above-described processing is applied to a semiconductor device which has row redundant circuits for the number of r and column redundant circuits for the number of c, the situation is as described below. That is, when defective bits having occurred in the semiconductor device require to be relieved by the column redundant circuits of at least c+1, only the processing of "new registration of defect information" or "update of defect information" is carried out in the row-side defect information accumulating table 41, and at that time, the value to be stored in the "row count" is set to c+1.

According to the ninth embodiment, when the defective bits having occurred at the same time is c+1 or more, the defect information is accumulated in the row-side defect information accumulating table 41, and the defect information is not stored in the column-side defect information accumulating table 42. Thereby, the capacity of the column-side defect information accumulating table 42 can be saved, and the defect information accumulating algorithm can be simplified.

In a tenth embodiment, there is provided a defect information accumulation processing device comprising a defect information storing device which enables the defect information accumulating operation as well as the memory test, by loading the defect information accumulating method to the hardware.

FIG. 27 is a diagram which schematically shows the signal flow in the defect information accumulation processing device 1 according to this invention. This defect information accumulation processing device 1 comprises, a semiconductor memory cell 101 such as a semiconductor chip, being an object to be tested, a judgment circuit 21 which compares an output value Q of a plurality of readout data from the semiconductor memory cell 101 with an expected value EXP, a defect information storing section 40 which stores already accumulated defect data, and a defect information accumulating algorithm section 31 which generates data $D_{in}$ to be newly accumulated, from the output value IN of the defect information from the judgment circuit 21 and the readout data $D_{out}$ from the defect information storing section 40. Here, a test address "Address" is also input to the defect information accumulating algorithm section 31. The judgment circuit 21 corresponds to the defect address detection section 2 in FIG. 10, and the defect information accumulating algorithm section 31 corresponds to the defect information processor 3 in FIG. 10.

FIG. 28 is a chart which shows the test sequence and the waveform of the defect information accumulating operation which is simultaneously performed, when the memory 101 is DRAM. The operation of the DRAM is constituted by repetitive operation of ACT for selecting a row address, RD for reading out the cell value by selecting a column address, and PRE for precharging the Bit line. The signals Q, IN, Address, $D_{out}$ and $D_{in}$ in FIG. 28 respectively correspond to signals of an output value Q from the memory 101, the defect information IN input from the judgment circuit 21 to the defect information accumulating algorithm section 31, the address information Address in the semiconductor memory cell 101 during the test, the readout data $D_{out}$ from the defect information storing section 40, and writing data $D_{in}$ from the defect information accumulating algorithm section 31, shown in FIG. 27. CLK denotes a clock signal.

After the ACT signal for selecting a row address in the memory 101 has been issued, and the RD signal for reading out the cell value by selecting a column address has been issued, until the readout output value Q is actually output from the memory 101, a delay of several clocks exists in general. The judgment circuit 21 compares the readout output value Q with the readout expected value EXP, and the output signal thereof becomes the defect information IN. For example, of a plurality of defect information IN, a signal line "1" means a defect, and a signal line "0" means a normal state. This defect information IN is input to the defect information accumulating algorithm section 31. At the same time, the readout data $D_{out}$ is read out from the defect information storing section 40, and input to the defect information accumulating algorithm section 31. The defect information accumulating algorithm section 31 generates writing data $D_{in}$ of new defect information, from the defect information IN, the readout data $D_{out}$ and the test address signal "Address", and this writing data $D_{in}$ is written in the defect information storing section 40.

FIG. 29 is a circuit diagram which shows one example in which the defect information accumulation processing device 1 is installed in the hardware. In this FIG. 29, reference numeral 21 denotes a judgment circuit, 31 denotes an arithmetic logic circuit (defect information accumulating algorithm section), 51 denotes a flip-flop, 52 denotes a selector and 53 denotes a clock generation circuit.

To the arithmetic logic circuit 31, there are input the readout data $D_{out}$ from the flip-flop 51, the output signal In from the judgment circuit 21 and the address signal Address. Here, during the period of from output of these signals until these signals are input to the arithmetic logic circuit 31, a delay circuit is not inserted. Therefore, these signals are subjected to the processing relating to accumulation of the defect information in the arithmetic logic circuit 31, at the same clock and according to the above-described method. Then, a signal $D_{CL}$ is output from an output terminal of the arithmetic logic circuit 31.

The signal $D_{CL}$ output from the arithmetic logic circuit 31 and an initializing signal Init are input to the selector 52, and the signal $D_{CL}$ or the initializing signal Init, which is selected according to the value of a selector signal SEL, is output from the output terminal as a signal $D_{in}$. In the example shown in FIG. 29, it is set such that when it is the selector signal SEL=1, the selector 52 outputs $D_{in}=D_{CL}$, and when it is the selector signal SEL=0, the selector 52 outputs $D_{in}$=Init. However, this selector signal SEL is used by being changed over, depending on whether it is in the defect information accumulating mode or not.

This $D_{in}$ signal is input from an input terminal of the flip-flop 51. The flip-flop 51 outputs the value, which is held at the time of start of the clock signal CLK, as $D_{out}$, and at the same time, newly holds the signal $D_{in}$ input from the input terminal.

As described above, the defect information accumulation processing device 1 is installed in the hardware according to the circuit configuration such that the writing data $D_{in}$ newly written by the defect information storing section 40 is generated by 1 clock. Therefore, it becomes possible to carry out the test of the memory 101, which is a repetition of ACT-RD-PRE shown in FIG. 28, and the accumulation of the defect data at the same time.

According to the tenth embodiment, since the memory test of the semiconductor memory cell 101 to be tested as well as the defect information accumulating operation of the semiconductor memory cell 101 can be carried out at the same time, this invention is applicable to a defect information storing device on a tester or a performance board and an on-chip defect information storing device. Particularly, when it is the on-chip type, high speed operation can be realized, which cannot be realized by the tester or performance board, and there is the effect that reduction of the number of pins between the chip and an external device becomes possible.

A defect information accumulating method in the form including all the defect information accumulating methods explained in the fifth to the eighth embodiments will be explained below as an eleventh embodiment.

FIG. 30 is a diagram which schematically shows an algorithm including all the defect information accumulating methods explained in the fifth to the eighth embodiments for the semiconductor device which has row redundant circuits for the number of r and column redundant circuits for the number of c. Items arranged vertically on the left side in this figure are roughly divided by whether the defect information relating to the row of an occurred defective bit coincides with the "row address" already accumulated in the row-side defect information accumulating table 41 or not. When the defect information coincides therewith, the items are further divided according to whether the "row count" corresponding to the coinciding "row address" is at least c or less than c. Items arranged laterally on the upper side of this figure are roughly divided by whether the defect information relating to the column of the occurred defective bit coincides with the "column address" already accumulated in the column-side defect information accumulating table 42 or not. When the defect information coincides therewith, the items are further divided according to whether the "column count" corresponding to the coinciding "column address" is at least r or less than r.

In this manner, in FIG. 30, since the row-side processing and the column-side processing are respectively three, the processing conditions of 3×3=9 exist, and the respective processing conditions are written therein. Numbers added to the processing conditions for convenience sake are shown on the upper stage of each column, and the content of the row-side processing is shown in the middle stage of each column, and the content of the column-side processing is shown in the lower stage of each column. For example, in the processing condition of the detected defective bit, when the row and column addresses coincide with the row and column addresses of the already existing defective bit, and the row count<c, and the column<r, number "1-1" is given. In this case, there are defined processing of adding 1 to the "row count" of the line of the row-side defect information accumulating table 41, in which the row address of the defective bit is stored, and adding a column ID to a vacant field of the "column ID", and processing of adding 1 to the "column count" of the line of the column-side defect information accumulating table 42, in which the column address of the defective bit is stored. The above is one example, and in FIG. 30, the processing conditions explained in the fifth to the eighth embodiments are all included.

For example, as explained in the fifth embodiment, the processing for carrying out the "new registration of defect information", when the occurred defective bit is compared with the defect address already accumulated in the defect information storing section 40, and as a result, the row or column address does not coincide therewith, corresponds to the processing numbers 1-3, 3-1 and 3-3 in FIG. 30. The processing of performing "update of defect information" when the row and column addresses both coincide therewith, corresponds to the processing number 1-1 in FIG. 30.

As explained in the sixth embodiment, the processing to be carried out when there is no vacant line in the defect information storing section 40 at the time of "new registration of defect information" correspond to when the "new registration" processing of the processing numbers 1-3, 3-1 or 3-3 in FIG. 30 is attempted, but there is no vacant line for storing the defect information of the defective bit in the defect information storing section 40, and hence relief is impossible.

As explained in the seventh embodiment, the processing to be carried out when the occurred defective bit is compared with the defect address already accumulated in the defective bit storing section 40, and as a result, the row address coincides therewith and the "row count" exceeds c, the column address coincides therewith and the "column count" is less than r, or the column address does not coincide therewith, corresponds to the processing numbers 2-1 and 2-3 in FIG. 30. Further, in the processing to be carried out when the occurred defective bit is compared with the defect address already accumulated in the defective bit storing section 40, and as a result, the column address coincides therewith and the "column count" exceeds r, and the row address coincides therewith and the "row count" is less than c, or the row address does not coincide therewith, the processing with respect to the row-side defect information accumulating table 41 is not performed, like the processing of the processing numbers 1-2 and 3-2 in FIG. 30.

As explained in the eighth embodiment, the processing of setting the upper limit of the "row count" to c+1, and the upper limit of the "column count" to r+1 corresponds to the processing numbers 1-2, 2-1, 2-2, 2-3 and 3-2 in FIG. 30.

Figures 35, 36:
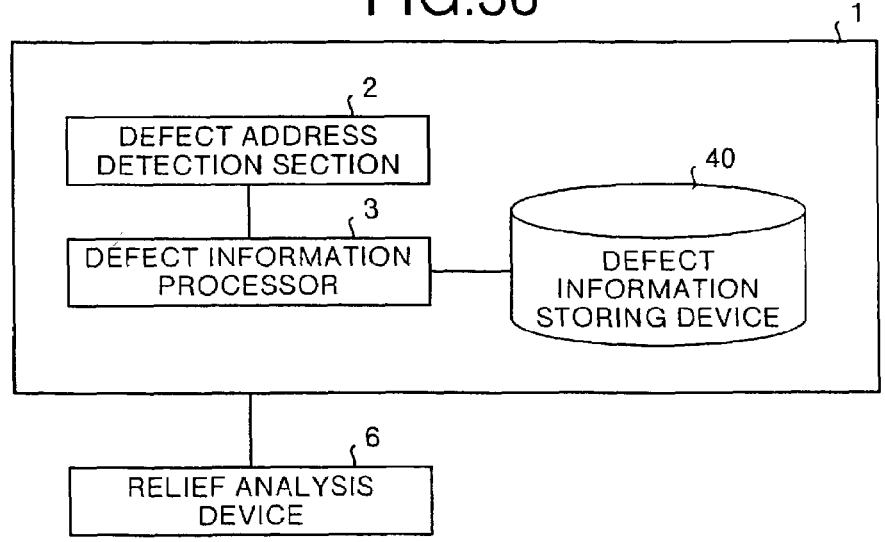
FIG. 35 is a diagram which shows by which processing condition in FIG. 30 each defective bit shown in FIG. 31 is processed.
FIG. 36 is a block diagram which shows the configuration of a semiconductor device-testing device comprising a defect information accumulation processing device.
Figure 37:
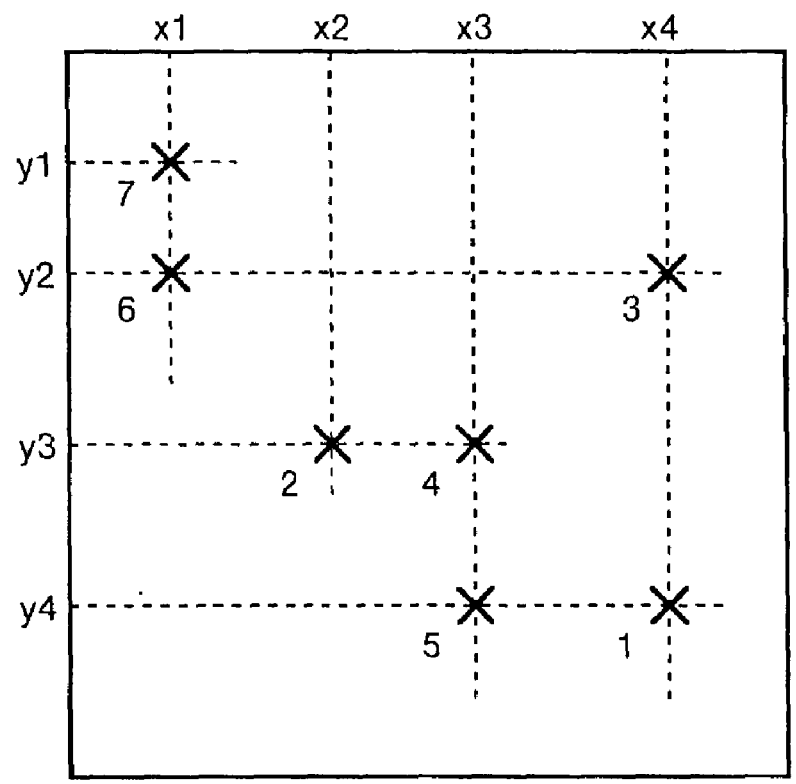
FIG. 37 is a diagram which shows a conventional example of a defect information storing device.
Figure 38:
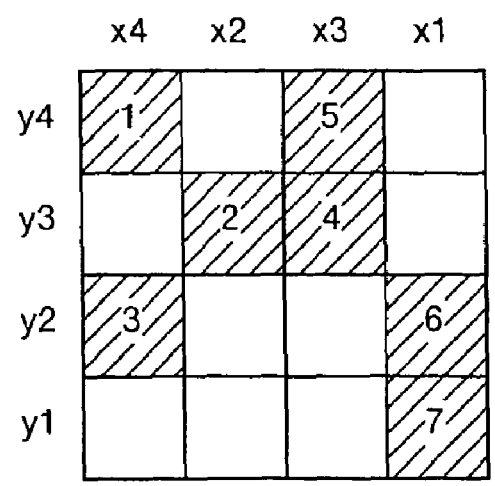
FIG. 38 is a diagram which shows a conventional example of a defect information storing device.

As in the fifth embodiment, in the semiconductor memory cell 101 to be tested having the redundant configuration shown in FIG. 11, when defective bits as shown in the matrix display in FIG. 31 occur, the processing method for accumulating the defect information by the defect information accumulation processing device 1 shown in FIG. 10 will be schematically explained below. The figures in FIG. 31 indicate the order of occurrence of the defective bits. The defective bits occurred in the semiconductor memory cell 101 to be tested are processed according to the procedure explained in the fifth to the eighth embodiments, that is, the appropriate processing condition shown in FIG. 30, in order of from the defective bit 1. The processing has been already explained in the fifth to the eighth embodiments, and hence the explanation thereof is omitted. As shown in FIG. 32A through FIG. 32E, FIG. 33A through FIG. 33E, and FIG. 34A through FIG. 34D, the defect information of defective bits is stored in order in the defective bit storing section 40. FIG. 35 shows the processing contents shown in FIG. 30, to be carried out in each of the defective bits 1 to 14.

As shown in the FIG. 32A through FIG. 32E, FIG. 33A through FIG. 33E, FIG. 34A through FIG. 34D, and FIG. 35, the defect information of defective bits 1 to 13 occurred in the semiconductor memory cell 101 to be tested is stored in the defect information storing section 40, according to the processing conditions shown in FIG. 30. However, the defective bit 14 has neither the same row address nor the same column address as that of the defective bits 1 to 13 which have occurred before. Therefore, this defect information should be newly registered in the defect information storing section 40, but there is no vacant line for accumulating the defect information of this defective bit 14 in the row-side defect information accumulating table 41, and it is judged that the defective bit 14 cannot be relieved. Therefore, it is judged that the whole semiconductor memory cell 101 cannot be relieved by the redundant configuration.

According to the eleventh embodiment, a defect information accumulating method can be set with respect to the compact defect information accumulating table which includes the number of defective counts for both of the "row count" and the "column count", other than the address information of the defective bit.

As a twelfth embodiment, a semiconductor device-testing device can be obtained by using the defect information accumulating method and the device therefor explained in the first to the eleventh embodiments. FIG. 36 is a block diagram which shows the configuration of the semiconductor device-testing device. As shown in FIG. 36, the semiconductor device-testing device comprises a relief analysis device 6 and the defect information accumulation processing device 1. FIG. 9 shows detail configuration of the defect information storing device having a plurality of blocks.

The defect information accumulation processing device 1 performs processings as described below. That is, it accumulates row and column address of a defective bit occurred in the semiconductor device, and the defect information comprising the number of other defective bits existing on the row and column address in the defect information storing section 40, as described above. The relief analysis device 6 performs relief judgment relating to whether it is possible to relieve the defective bit in the semiconductor memory cell 101 to be tested by the combination of the row and column redundant circuits, according to a known method, based on the defect information accumulated in the defect information storing section 40. As a result of judgment, if the relief is possible, the defective bit is relieved by the row and/or column redundant circuit, and if the relief is impossible, the relief is not performed. However, since the defect information accumulation processing device 1 has already performed the relief analysis based on the defect information obtained by counting the number of defective bits existing on the row and column address of the defective bit, this relief analysis device 6 need not count the number of defective bits at the time of relief judgment. Therefore, a circuit and a function for counting the number of defective bits in the relief analysis device 6, which has been heretofore necessary, can be omitted.

According to the twelfth embodiment, by using the function of the defect information accumulation processing device 1 or the defect information accumulating method explained in the first to the eleventh embodiments for the semiconductor device-testing device, it is not necessary to count the defective bits existing on the row and column address of the defective bit in the relief analysis device 6, and hence the processing of relief analysis can be quickly carried out.

In the above-described each embodiment, the defect information storing device 4 or the defect information storing section 40 having the row-side defect information accumulating table 41 and the column-side defect information accumulating table 42 can be mounted on a semiconductor device, as the defect information storing device 4. Since this defect information storing device 4 has a small capacity, as described above, it can be arranged on the semiconductor device without any problem. Further, since the address of the defective bit, and the number of defective bits existing on the row and column address are stored, there is the effect that the time for the relief analysis of the semiconductor device in the semiconductor device-testing device can be shortened.

According to one aspect of the present invention, with respect to a semiconductor device which has row redundant circuits for the number of r and column redundant circuits for the number of c and a semiconductor memory, the address of a defective point, and the number of defective points existing on the row address and the column address are stored. As a result, there is the effect that the time required for the relief analysis of the semiconductor device can be shortened.

Moreover, the column-side defect information accumulating table has a table configuration capable of storing stored items consisting of a column address of the defective point and the number of defective points existing on this column address, for the number of (r×c+c) lines, and the row-side defect information accumulating table has a table configuration capable of storing stored items consisting of a row address of the defective point, the number of defective points existing on this row address, and c column identifiers for the number of (r×c+r) lines. As a result, there is the effect that the size of the defect information storing device is made minimum size necessary for the relief analysis of the semiconductor device.

Furthermore, with respect to each field of the defect information storing device, it is configured such that the maximum value of the figure stored in the field is set to the number of bits expressed by the binary notation with respect to respective fields of the defect information storing device, and hence there is the effect that the minimum number of bits required for the defect information storing device can be clarified.

Moreover, when the semiconductor device has the relief range of the row redundant circuit different from the relief range of the column redundant circuit, the defect information storing devices are prepared for the number of portions where the relief range of one row redundant circuit overlaps on the relief range of one column redundant circuit, which are formed on the semiconductor memory. As a result, there is the effect that the number of defect information storing devices required for the semiconductor device can be clarified even if the semiconductor device has a plurality of redundant configurations.

According still another aspect of the present invention, there are provided a defect information storing device, a defect address detection unit which detects an address of a defective point in the semiconductor memory, and a defect information processing unit which stores, in the defect storing device, defect information including the address of the detected defective point and the number of defective points existing on the row address or the column address of this defective point. As a result, there is the effect that the defect information including the address of the defective bit occurring on the semiconductor device and the number of defective bits existing on the row and column addresses can be efficiently accumulated in the defect information storing device.

Moreover, during the period of after one row address has been selected in the semiconductor memory until the next row address is selected by the defect address detection unit, the defect information of the defective point on the one row address is newly registered or updated in the defect information storing device by the defect information processing unit. As a result, there is the effect that high-speed operation can be realized, which cannot be realized by a tester or a performance board.

According still another aspect of the present invention, it is configured to include, a judgment step of judging whether the address of the detected defective bit has already been stored in the defect information storing device, a newly storing step of newly storing the defect information of the detected defective point in a vacant line of the row-side or column-side defect information accumulating table, when it is judged that it has not been stored, and a updating step of updating the defect information stored in the line where the coinciding row address in the row-side defect information accumulating table is stored, or in the line where the coinciding column address in the column-side defect information accumulating table is stored, when it is judged that it has been stored. As a result, there is the effect that the defect information including the address of the defective bit and the number of defective bits existing of the row and column addresses can be stored in a compact form.

Moreover, in the newly storing step, if there is no vacant line for storing defect information of the detected defective point in the row-side or column-side defect information accumulating table, the detected defective point cannot be relieved. As a result, there is the effect that the size of the defect information stored in the defect information storing device can be made a necessity minimum.

Furthermore, when a defect which can be relieved only by the row redundant circuit occurs, in the updating step, the defect information of the line in which the row address coinciding with the defective point in the row-side defect information accumulating table is stored is updated. On the other hand, in the updating step, the defect information of the line in which the column address coinciding with the defective point in the column-side defect information accumulating table is stored is not updated, or in the newly storing step, the processing for newly storing the defect information of the detected defective point in a vacant line in the column-side defect information accumulating table is not performed. When a defect which can be relieved only by the column redundant circuit occurs, in the updating step, the defect information of the line in which the column address coinciding with the defective point in the column-side defect information accumulating table is stored is updated. On the other hand, in the updating step, the defect information of the line in which the row address coinciding with the defective point in the row-side defect information accumulating table is stored is not updated, or in the newly storing step, the processing for newly storing the defect information of the detected defective point in a vacant line in the row-side defect information accumulating table is not performed. As a result, there is the effect that the size of the defect information stored in the defect information storing device can be made a necessity minimum.

Moreover, in the updating step, when the defect information of the detected defective point is stored in the row-side defect information accumulating table, it is set such that the maximum values stored in the number of defective points in the row-side and column-side defect information accumulating tables are c+1 and r+1, respectively. As a result, there is the effect that the size of the defect information stored in the defect information storing device can be made a necessity minimum.

Furthermore, in the judgment step, if it is detected that defective points of a number larger than that of the column redundant circuits have occurred simultaneously on the same row address of the semiconductor memory, then in the newly storing step, the row address of the detected defective point is newly registered in a vacant line of the row-side defect information accumulating table and c+1 is newly registered in the number of defective points. Alternatively, in the updating step, c+1 is update-registered in the number of defective points in the line where the row address coinciding with the defective points of the row-side defect information accumulating table is stored, and in the newly storing step and the updating step, the processing in the column-side defect information accumulating table is not performed. As a result, there is the effect that the size of the defect information stored in the defect information storing device can be made a necessity minimum. Further, there is another effect that the algorithm for accumulating defect information can be simplified.

According still another aspect of the present invention, there are provided a defect information accumulation processing device, and a relief analysis device which judges whether it is possible to relieve the semiconductor memory by the row redundant circuits and the column redundant circuits, based on the defect information stored in the defect information storing device in the defect information accumulation processing device, and when it is possible to relieve the semiconductor memory, performs the relief analysis of the semiconductor memory based on the judgment result. As a result, counting processing of the number of defective bits in the relief analysis device is omitted, thereby enabling quick processing of the relief analysis.

According still another aspect of the present invention, by providing a semiconductor device comprising the defect information storing device, relief of the defective point in the relief analysis device can be quickly performed based on the defect information storing device. As a result, there is the effect that the time for relief analysis can be shortened.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A defect information storing device which stores defect information of a semiconductor device, the semiconductor device having r row redundant circuits, c column redundant circuits, and a semiconductor memory, the defect information storing device comprising:
    a column-side defect information accumulating table which stores a column address of defective points, and number of the defective points existing at the column address stored, wherein the column-side defect information accumulating table stores the column address and the number of the defective points existing at the column address stored for (r×c+c) lines; and
    a row-side defect information accumulating table which stores a row address of the defective points, number of the defective points existing at the row address stored, and a column identifier indicating storage place of the column address of the defective points in the column-side defect information accumulating table, wherein the row-side defect information accumulating table stores the row address, the number of the defective points existing at the row address stored, and c column identifiers for (r×c+r) lines.

2. The defect information storing device according to claim 1, wherein
    the column-side defect information accumulating table prepares a first minimum number of bits for storing the column address, and prepares a second minimum number of bits for storing the maximum value (r+1) of the number of the defective points existing at the column address stored, and
    the row-side defect information accumulating table prepares a third minimum number of bits for storing the row addresses, prepares a fourth minimum number of bits for storing the maximum value (c1) of the number of the defective points corresponding to the number of the defective points, and prepares a fifth minimum number of bits for storing the maximum value (r×c+c) of the column identifier.

3. The defect information storing device according to claim 1, wherein, when the relief range of the row redundant circuit is different from the relief range of the column redundant circuit, the defect information storing device is prepared for the number of portions where the relief range of one row redundant circuit overlaps the relief range of one column redundant circuit of the semiconductor memory.

4. A defect information accumulation processing device comprising:
    a defect information storing device which stores defect information of a semiconductor device, the semiconductor device having r row redundant circuits, c and column redundant circuits, and a semiconductor memory, the defect information storing device including
        a column-side defect information accumulating table which stores a column address of a defective point, and number of the defective points existing at the column address stored for (r×c+c) lines;
        a row-side defect information accumulating table which stores a row address of the defective point, the number of the defective points existing at the stored row address, and a column identifier indicating storage place of the column address of the defective points in the column-side defect information accumulating table for (r×c+c) lines;
    a defect address detection unit which detects the address of the defective point of the semiconductor device; and
    a defect information processing unit which provides control for storing the defect information including the address of the defective point and the number of the defective points existing at the row address or the column address of this defective point in the defect information storing device.

5. The defect information accumulation processing device according to claim 4, wherein, after one row address has been selected in the semiconductor memory, until the next row address is selected by the defect address detection unit, the defect information of the defective point at the one row address is newly registered or updated in the defect information storing device by the defect information processing unit.

6. A defect information accumulating method for storing defect information including row and column addresses of a defective point of a semiconductor device, and number of the defective points existing as the row or column address in a defect information storing device,
    the semiconductor device having r row redundant circuits, c column redundant circuits, and a semiconductor memory,
    the defect information storing device having
        a column-side defect information accumulating table which stores a column address of a defective point, and number of the defective points existing as the stored column address for (r×c+c) lines; and
        a row-side defect information accumulating table which stores a row address of the defective point, the number of the defective points existing at the stored row address, and a column identifier indicating storage place of the column address of the defective points in the column-side defect information accumulating table for (r×c+r) lines, the method comprising:
    detecting column and row address of the defective point in the semiconductor memory;
    determining whether the detected column and row address of the defective point has been already stored in the defect information storing device;
    when the detected column and row address of the defective point has not been stored in the defect information storing device, newly storing the defect information of the defective point in a vacant line of the row-side or column-side defect information accumulating tables; and when the detected column and row address of the defective point has already been stored in the defect information storing device, updating the defect information stored in the line where the coinciding row address in the row-side defect information accumulating table is stored, or in the line where the coinciding column address in the column-side defect information accumulating table is stored.

7. The defect information accumulating method according to claim 6, wherein, when there is no vacant line for storing the defect information of the detected defective point in the row-side or column-side defect information accumulating, tables, determining that the detected defective point cannot be relieved.

8. The defect information accumulating method according to claim 6, wherein when the number of defective points existing at the same column address exceeds r, the number of defective points existing at the same row address is less than c, update processing or new registration processing of the defect information for the row-side defect information accumulating table relating to the defective point is not performed, and only new registration processing of the defect information for the column-side defect information accumulating table relating to the defective point is performed, and when the number of defective points existing at the same row address exceeds c, the number of defective points existing at the same column address is less than r, the update processing or the new registration processing of the defect information for the column-side defect information accumulating table relating to the defective point is not performed, and, only new registration processing of the defect information for the row-side defect information accumulating table relating to the defective point is performed.

9. The defect information accumulating method according to claim 6, wherein, when the defect information of the detected defective point is stored in the row-side defect information accumulating table, if at least c defective points exist for the row address, a maximum value of the number of defective points is stored in the row-side defect information accumulating table is c+1, and when the defect information of the detected defective point is stored in the column-side defect information accumulating table, if at least r defective points exist for the column address of the defective point, a maximum value of defective points in the column-side defect information accumulating table is r+1.

10. The defect information accumulating method according to claim 6, wherein, when simultaneous detection of at least c+1 defective points occurs for the same row address of the semiconductor memory, the row address of the detected defective point is newly registered in a vacant line of the row-side defect information accumulating table and c+1 is newly registered for the number of the defective points, or c+1 is update-registered for the number of defective points in the line where the row address coinciding with the defective point of the row-side defect information accumulating table is stored, and processing in the column-side defect information accumulating table is not performed.

* * * * *